US012520683B2

(12) United States Patent
Yuan et al.

(10) Patent No.: US 12,520,683 B2
(45) Date of Patent: Jan. 6, 2026

(54) MULTI-CONTROL AREA DISPLAY SUBSTRATE AND DRIVING METHOD THEREOF, DISPLAY DEVICE

(71) Applicants: Hefei BOE Joint Technology Co., Ltd., Anhui (CN); BOE TECHNOLOGY GROUP CO., LTD., Beijing (CN)

(72) Inventors: Can Yuan, Beijing (CN); Liu Wu, Beijing (CN); Zhidong Yuan, Beijing (CN); Luke Ding, Beijing (CN); Yongqian Li, Beijing (CN); Cheng Xu, Beijing (CN); Dandan Zhou, Beijing (CN); Dacheng Zhang, Beijing (CN)

(73) Assignees: Hefei BOE Joint Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 50 days.

(21) Appl. No.: 18/558,247

(22) PCT Filed: Oct. 28, 2022

(86) PCT No.: PCT/CN2022/128244
§ 371 (c)(1),
(2) Date: Oct. 31, 2023

(87) PCT Pub. No.: WO2024/087167
PCT Pub. Date: May 2, 2024

(65) Prior Publication Data
US 2025/0098446 A1 Mar. 20, 2025

(51) Int. Cl.
*H10K 59/131* (2023.01)
*G09G 3/3225* (2016.01)

(52) U.S. Cl.
CPC ......... *H10K 59/131* (2023.02); *G09G 3/3225* (2013.01); *G09G 2300/0426* (2013.01);
(Continued)

(58) Field of Classification Search
CPC ............... H10K 59/131; G09G 3/3225; G09G 2300/0426; G09G 2300/0819;
(Continued)

(56) References Cited

U.S. PATENT DOCUMENTS 9,995,976 B2 6/2018 Jia et al.
11,074,864 B1 7/2021 Lu et al.
(Continued)

FOREIGN PATENT DOCUMENTS

CN 101630479 A 1/2010
CN 101740581 A 6/2010
(Continued)

OTHER PUBLICATIONS

Written Opinion and International Search Report dated Jun. 16, 2023, issued in counterpart Application No. PCT/CN2023/071888, with English translation. (20 pages).
(Continued)

*Primary Examiner* — Afroza Chowdhury
(74) *Attorney, Agent, or Firm* — WHDA, LLP

(57) ABSTRACT

A display substrate and driving method thereof, a display device are provided. The display substrate includes: a base substrate, and a plurality of repeating units and a plurality of data lines on the base substrate, the plurality of repeating units are divided into plurality of repeating unit columns; each repeating unit includes a plurality of subpixels, the subpixel includes a subpixel driving circuit, the subpixel driving circuit includes a data writing transistor, a writing control transistor and a driving transistor; the first electrode of the data writing transistor is coupled to the corresponding
(Continued)

data line, the second electrode of the data writing transistor is coupled to the first electrode of the writing control transistor, and the second electrode of the writing control transistor is coupled to the gate of the driving transistor.

17 Claims, 11 Drawing Sheets

(52) U.S. Cl.
CPC ............... *G09G 2300/0819* (2013.01); *G09G 2300/0852* (2013.01); *G09G 2300/0861* (2013.01); *G09G 2310/08* (2013.01); *G09G 2320/0223* (2013.01)

(58) Field of Classification Search
CPC ... G09G 2300/0852; G09G 2300/0861; G09G 2310/08; G09G 2320/0223
See application file for complete search history.

(56) References Cited

U.S. PATENT DOCUMENTS

| | | | | |
|---|---|---|---|---|
| 11,114,030 | B1 | 9/2021 | Lu | |
| 11,355,075 | B2 | 6/2022 | Kang | |
| 12,057,068 | B2 * | 8/2024 | Sakaguchi | G09G 3/2007 |
| 2009/0322730 | A1 | 12/2009 | Yamamoto et al. | |
| 2011/0199357 | A1 | 8/2011 | Chung et al. | |
| 2011/0266535 | A1 | 11/2011 | Li et al. | |
| 2015/0115292 | A1 | 4/2015 | Jeon et al. | |
| 2016/0180770 | A1 | 6/2016 | Duan et al. | |
| 2017/0108745 | A1 | 4/2017 | Jia et al. | |
| 2017/0270867 | A1 | 9/2017 | Zhu et al. | |
| 2018/0357964 | A1 | 12/2018 | Shin et al. | |
| 2019/0005877 | A1 | 1/2019 | Dong | |
| 2019/0051243 | A1 | 2/2019 | Li et al. | |
| 2019/0371243 | A1 | 12/2019 | Yang et al. | |
| 2019/0385520 | A1 | 12/2019 | Chen | |
| 2020/0234649 | A1 | 7/2020 | Fan et al. | |
| 2021/0012720 | A1 | 1/2021 | Kang | |
| 2021/0057450 | A1 | 2/2021 | Wu et al. | |
| 2021/0091161 | A1 | 3/2021 | Baek et al. | |
| 2021/0166614 | A1 | 6/2021 | Yao et al. | |
| 2021/0183977 | A1 | 6/2021 | Xiao et al. | |
| 2021/0257440 | A1 | 8/2021 | Long et al. | |
| 2021/0272517 | A1 | 9/2021 | Chen et al. | |
| 2021/0328002 | A1 | 10/2021 | Lee et al. | |
| 2021/0376003 | A1 | 12/2021 | Xu et al. | |
| 2022/0068182 | A1 | 3/2022 | Lee et al. | |
| 2022/0157856 | A1 | 5/2022 | Choung et al. | |
| 2022/0165217 | A1 | 5/2022 | Lee et al. | |
| 2022/0173189 | A1 | 6/2022 | Kim et al. | |
| 2022/0180816 | A1 | 6/2022 | Yuan et al. | |
| 2022/0246086 | A1 | 8/2022 | Son et al. | |
| 2022/0352296 | A1 | 11/2022 | Yi et al. | |
| 2022/0367596 | A1 | 11/2022 | Chen et al. | |
| 2023/0005421 | A1 | 1/2023 | Sakaguchi et al. | |
| 2023/0021680 | A1 | 1/2023 | Li et al. | |
| 2023/0030891 | A1 | 2/2023 | Du et al. | |
| 2023/0091012 | A1 | 3/2023 | Yuan et al. | |
| 2023/0095733 | A1 | 3/2023 | Yuan et al. | |
| 2023/0196975 | A1 | 6/2023 | Zong et al. | |
| 2023/0351958 | A1 | 11/2023 | Liu | |
| 2023/0410759 | A1 | 12/2023 | Zong et al. | |
| 2024/0119897 | A1 | 4/2024 | Zhang et al. | |

FOREIGN PATENT DOCUMENTS

| | | | |
|---|---|---|---|
| CN | 102842283 | A | 12/2012 |
| CN | 103035195 | A | 4/2013 |
| CN | 103943067 | A | 7/2014 |
| CN | 105159001 | A | 12/2015 |
| CN | 105845081 | A | 8/2016 |
| CN | 106157896 | A | 11/2016 |
| CN | 106531074 | A | 3/2017 |
| CN | 106782339 | A | 5/2017 |
| CN | 108806582 | A | 11/2018 |
| CN | 108986749 | A | 12/2018 |
| CN | 109003583 | A | 12/2018 |
| CN | 109166896 | A | 1/2019 |
| CN | 109817157 | A | 5/2019 |
| CN | 110111738 | A | 8/2019 |
| CN | 209729911 | U | 12/2019 |
| CN | 111312160 | A | 6/2020 |
| CN | 111369946 | A | 7/2020 |
| CN | 111429842 | A | 7/2020 |
| CN | 111508977 | A | 8/2020 |
| CN | 111599846 | A | 8/2020 |
| CN | 111816123 | A | 10/2020 |
| CN | 112071882 | A | 12/2020 |
| CN | 112309345 | A | 2/2021 |
| CN | 112542437 | A | 3/2021 |
| CN | 112713157 | A | 4/2021 |
| CN | 113272963 | A | 8/2021 |
| CN | 113540172 | A | 10/2021 |
| CN | 113658995 | A | 11/2021 |
| CN | 113675252 | A | 11/2021 |
| CN | 113838421 | A | 12/2021 |
| CN | 114120905 | A | 3/2022 |
| CN | 114175257 | A | 3/2022 |
| CN | 114241996 | A | 3/2022 |
| CN | 114255704 | A | 3/2022 |
| CN | 114497143 | A | 5/2022 |
| CN | 114582288 | A | 6/2022 |
| CN | 114725181 | A | 7/2022 |
| CN | 114746932 | A | 7/2022 |
| CN | 114882838 | A | 8/2022 |
| CN | 114902320 | A | 8/2022 |
| CN | 115023755 | A | 9/2022 |
| CN | 115087956 | A | 9/2022 |
| JP | 2008-197607 | A | 8/2008 |
| JP | 2009-288748 | A | 12/2009 |
| WO | 2019/024395 | A1 | 2/2019 |

OTHER PUBLICATIONS

Written Opinion and International Search Report dated Jul. 6, 2023, issued in counterpart Application No. PCT/CN2022/128241, with English translation. (16 pages).
Written Opinion and International Search Report dated Jun. 23, 2023, issued in counterpart Application No. PCT/CN2022/128244, with English translation. (16 pages).
Written Opinion and International Search Report dated May 28, 2023, issued in counterpart Application No. PCT/CN2022/128272, with English translation. (24 pages).
Written Opinion and International Search Report dated Mar. 14, 2023, issued in counterpart Application No. PCT/CN2023/071892, with English translation. (21 pages).
Chang Tianhai and Gao Yang, Study on The Display Apparatus of OLED'S Driving Circuit, China Academic Journal Electronic Publishing House, 2011, wtih English translation. (12 pages).
Extended (Supplementary) European Search Report dated Apr. 7, 2025, issued in counterpart EP Application No. 22963155.1. (10 pages).
Non-Final Office Action dated Apr. 9, 2025, issued in U.S. Appl. No. 18/555,023 (15 pages).
Non-Final Office Action dated Apr. 18, 2025, issued in U.S. Appl. No. 18/558.500 (20 pages).
Extended (Supplementary) European Search Report dated Jul. 9, 2025, issued in counterpart EP Application No. 23881007.1. (10 pages).

* cited by examiner

MULTI-CONTROL AREA DISPLAY SUBSTRATE AND DRIVING METHOD THEREOF, DISPLAY DEVICE

CROSS-REFERENCE TO RELATED APPLICATION

The present application is the U.S. national phase of PCT Application No. PCT/CN2022/128244 filed on Oct. 28, 2022, which is incorporated herein by reference in its entirety.

TECHNICAL FIELD

The present disclosure relates to the field of display technology, in particular to a display substrate and driving method thereof, display device.

BACKGROUND

With the continuous development of display technology, the application range of display products is becoming more and more extensive, high-resolution and high-refresh rate display products are more and more favored. However, medium and large size display products cannot well realize the product function of high refresh rate due to large load and hardware data transmission restrictions.

SUMMARY

The object of the present disclosure is to provide a display substrate and driving method thereof, display device.

In order to achieve the above purposes, the present disclosure provides the following technical programs:

In a first aspect, the present disclosure provides a display substrate, including: a base substrate, and a plurality of repeating units and a plurality of data lines on the base substrate, the plurality of repeating units are divided into plurality of repeating unit columns;

each repeating unit includes a plurality of subpixels, the subpixel includes a subpixel driving circuit, the subpixel driving circuit includes a data writing transistor, a writing control transistor and a driving transistor; the first electrode of the data writing transistor is coupled to the corresponding data line, the second electrode of the data writing transistor is coupled to the first electrode of the writing control transistor, and the second electrode of the writing control transistor is coupled to the gate of the driving transistor;

the display substrate further includes: a plurality of control areas and a plurality of area control lines; the control area includes at least one repeating unit column; the area control line is coupled to the gates of the writing control transistors included in each repeating unit column in the corresponding control area.

optionally, the area control line includes: a control bus and at least one control branch line;

the control branch line is coupled to the gates of each writing control transistor included in a corresponding column of repeating unit column in the corresponding control area;

the control bus is coupled to at least one control branch line.

optionally, the control branch line includes: a first branch line and a plurality of second branch lines; the second branch line includes at least a portion extending in the first direction, and the plurality of second branch lines are arranged in the second direction; the first branch line includes at least a portion extending in the second direction, the first branch line is coupled to the plurality of second branch lines, the first branch line is coupled to the control bus; the first direction intersects with the second direction;

the second branch line is coupled to the gates of each writing control transistor included in the corresponding repeating unit.

Optionally, in the same control area, the adjacent second branch lines in the first direction are coupled with each other.

Optionally, in the same control area, the adjacent second branch lines in the first direction are independent from each other.

Optionally, the display substrate further includes a plurality of power lines, the orthographic projection of the second branch line on the base substrate does not overlap with the orthographic projection of the power line on the base substrate.

Optionally, the orthographic projection of the data line on the base substrate and the orthographic projection of the second branch line on the base substrate have a first overlapping area, and the area of the first overlapping areas formed by each data line is the same.

Optionally, the first branch line is made of a first gate metal layer in the display substrate, and the second branch line is made of a first source leakage metal layer in the display substrate.

Optionally, the writing control transistor includes a single-gate structure.

Optionally, the display substrate further includes: a plurality of first scan lines, a plurality of second scan lines, a plurality of third scan lines, a plurality of light-emitting control lines, power lines, reference signal lines and initialization signal lines;

the subpixel driving circuit further includes: a compensation transistor, a reset transistor, a light-emitting control transistor and a storage capacitor;

the gate of the data writing transistor is coupled to the corresponding first scan line;

the gate of the compensation transistor is coupled to the corresponding second scan line, the first electrode of the compensation transistor is coupled to the reference signal line, and the second electrode of the compensation transistor is coupled to the first electrode of the writing control transistor;

the gate of the reset transistor is coupled to the corresponding third scan line, the first electrode of the reset transistor is coupled to the initialization signal line, and the second electrode of the reset transistor is coupled to the second electrode of the driving transistor;

the gate of the light-emitting control transistor is coupled to the corresponding light-emitting control line, the first electrode of the light-emitting control transistor is coupled to the power line, and the second electrode of the light-emitting control transistor is coupled to the first electrode of the driving transistor;

the first plate of the storage capacitor is coupled to the gate of the driving transistor, and the second plate of the storage capacitor is coupled to the second electrode of the driving transistor.

Optionally, the data writing transistor, the compensation transistor and the reset transistor all include a double-gate structure.

Based on the technical programs of the display substrate, a second aspect of the present disclosure provides a driving method for a display substrate, configured to drive the display substrate, the driving method including:

in the N-frame display period, the zone control signals transmitted by at least part of the multiple area control lines in the display substrate are at an active level, and the writing control transistors coupled to at least part of the area control lines are conductive, and the plurality of subpixels are scanned progressively to achieve progressive writing of data signals;

in the N+1 frame display period, the level of the zone control signals transmitted by the plurality of area control lines change, so that the writing control transistor coupled to the area control line is conductive, wherein the zone control signal transmitted by the area control line is at an active level, and the plurality of subpixels is scanned progressively to achieve progressive writing of data signals.

Optionally, the driving method further includes:

a blanking period, which is located at the beginning or end of each frame's display period; during the blanking period, the levels of the zone control signals transmitted by the plurality of area control lines are adjusted.

Based on the technical programs of the above display substrate, a third aspect of the present disclosure provides a display device, including the above display substrate.

DETAILED DESCRIPTION

Figure 1:
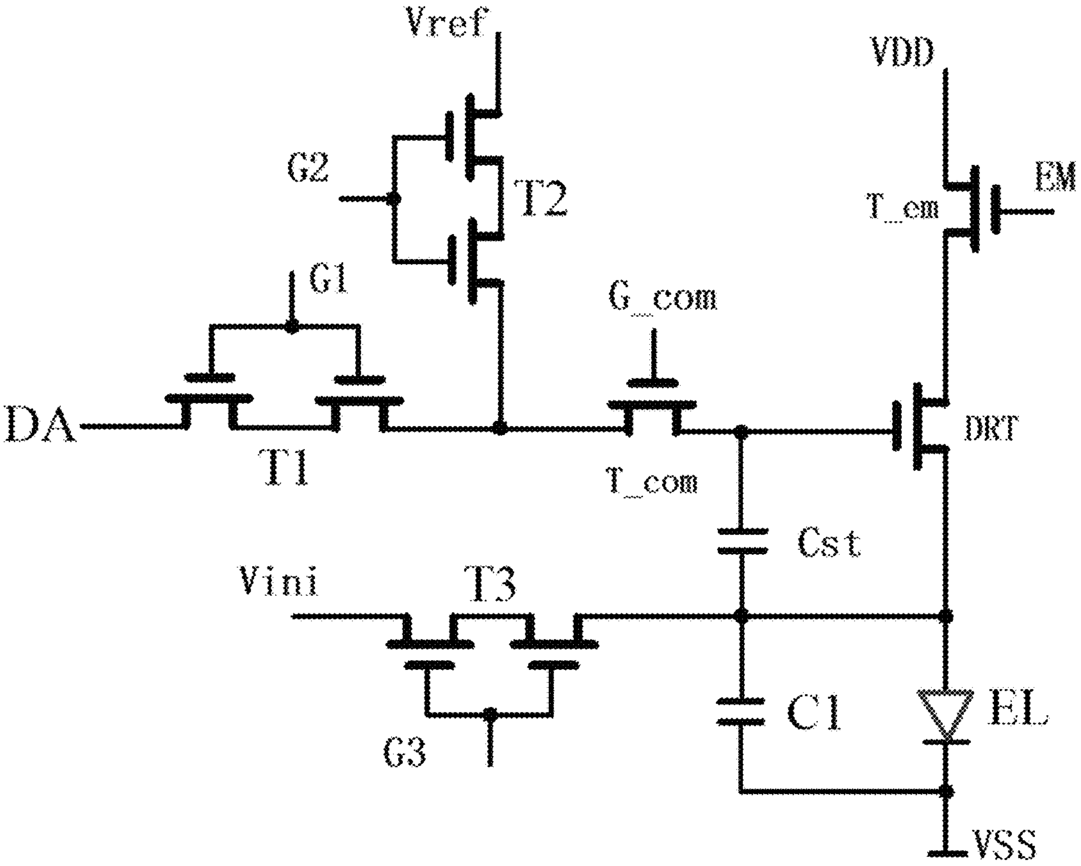
FIG. 1 is a circuit diagram of the subpixel driving circuit according to an embodiment of the present disclosure.
Figure 2:
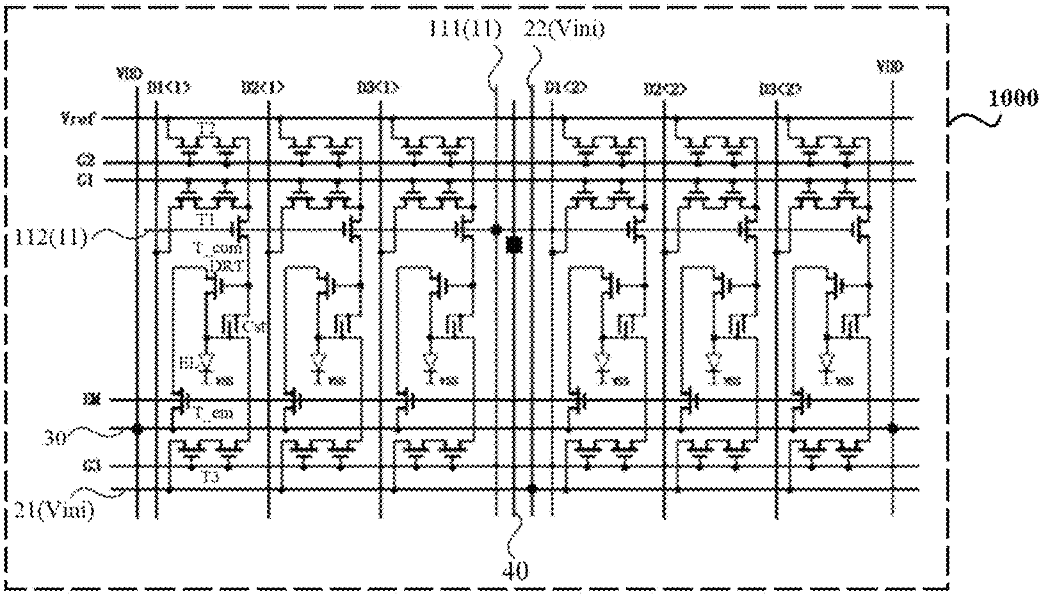
FIG. 2 is a schematic diagram of the circuit structure of the repeating unit according to an embodiment of the present disclosure.

In order to further illustrate the display substrate and driving method thereof, display device provided in the present embodiment, the following is described in detail in conjunction with the drawings of the description.

Referring to FIG. 1, FIG. 2, FIG. 3, FIG. 5 and FIG. 21, the present embodiment provides a display substrate, including: a base substrate, and a plurality of repeating units 1000 and a plurality of data lines DA on the base substrate, the plurality of repeating units 1000 are divided into plurality of repeating unit columns 2000.

Each repeating unit 1000 includes a plurality of subpixels, the subpixel includes a subpixel driving circuit, the subpixel driving circuit includes a data writing transistor T1, a writing control transistor T_com and a driving transistor DRT; the first electrode of the data writing transistor T1 is coupled to the corresponding data line DA, the second electrode of the data writing transistor T1 is coupled to the first electrode of the writing control transistor T_com, and the second electrode of the writing control transistor T_com is coupled to the gate of the driving transistor DRT.

The display substrate further includes: a plurality of control areas (e.g., control area 1 to control area X) and a plurality of area control lines G_com; the control area includes at least one repeating unit column 2000; the area control line G_com is coupled to the gates of the writing control transistors T_com included in each repeating unit column 2000 in the corresponding control area.

Exemplary, the display substrate includes a plurality of repeating units 1000, the plurality of repeating units 1000 is distributed in arrays. The repeating unit 1000 includes a plurality of subpixels arranged in the first direction, for example: the repeating unit 1000 includes six subpixels arranged in the first direction, the six subpixels include BRGBRG arranged in the first direction, B represents a blue subpixel, R represents a red subpixel, and G represents a green subpixel.

Exemplary, the plurality of subpixels included in a plurality of repeating units 1000 is distributed in arrays, the plurality of subpixels can be divided into plurality of subpixel columns, the plurality of subpixel columns corresponds one-to -one with the plurality of data lines DA included in the display substrate.

Exemplary, the subpixel includes a subpixel driving circuit and a light-emitting element EL, the subpixel driving circuit is coupled to the light-emitting element EL to provide a driving signal for driving the light-emitting element EL to emit light.

Exemplary, the subpixel driving circuit includes a data writing transistor T1, a writing control transistor T_com and a driving transistor DRT; the first electrode of the data writing transistor T1 is coupled to the corresponding data line DA, the second electrode of the data writing transistor T1 is coupled to the first electrode of the writing control transistor T_com, and the second electrode of the writing control transistor T_com is coupled to the gate of the driving transistor DRT; in the case where the data writing transistor T1 and the writing control transistor T_com are both conductive, the data signal transmitted by the data line DA can be written to the gate of the driving transistor DRT; in the case where there is a cutoff in the data writing transistor T1 and the writing control transistor T_com, the data signal cannot be transmitted to the gate of the driving transistor DRT.

Exemplary, the display substrate further includes a plurality of control areas and a plurality of area control line G_com, the plurality of control areas are in a one-to-one correspondence with the plurality of area control lines G_com. The area control line G_com is coupled to the gates of the writing control transistors T_com included in each repeating unit column 2000 in the corresponding control area, for controlling the conduction or cutoff of the writing control transistors T_com included in each repeating unit column 2000 in the corresponding control area.

According to the specific structure of the above display substrate, the display substrate provided by the present embodiment includes a plurality of control areas, each control area includes at least one repeating unit column 2000, the area control line G_com is coupled to the gates of the writing control transistors T_com included in each repeating unit column 2000 in the corresponding control area. By controlling each area control line G_com, it is possible to control whether all writing control transistors T_com in the corresponding control area are conductive, in order to achieve the effect of controlling whether the area achieves a high refresh rate.

Figure 3:
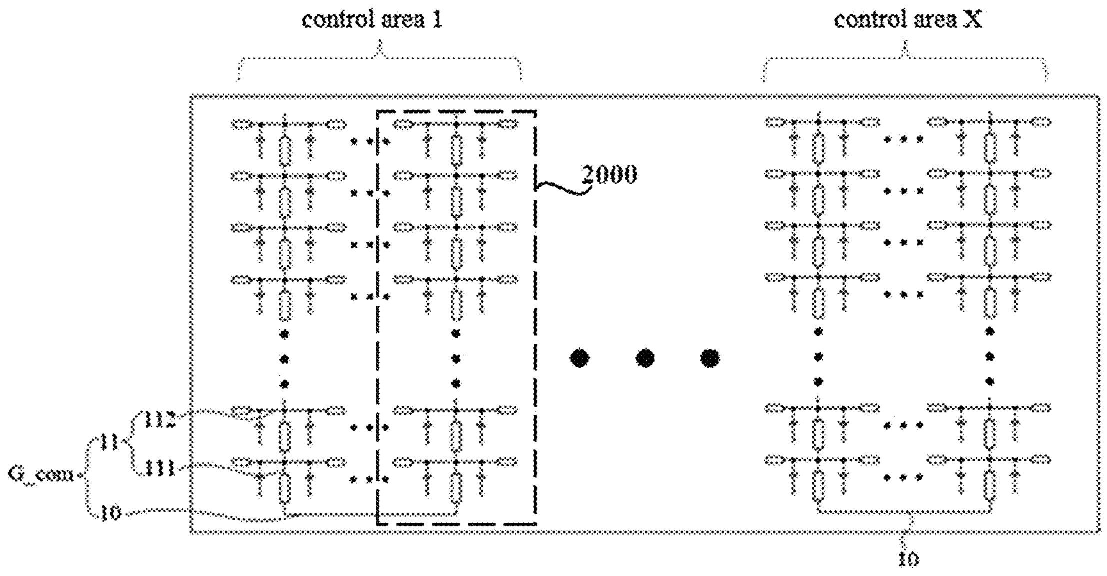
FIG. 3 is a schematic diagram of the resistance-capacitance equivalent of the area control line according to an embodiment of the present disclosure.
Figure 4:
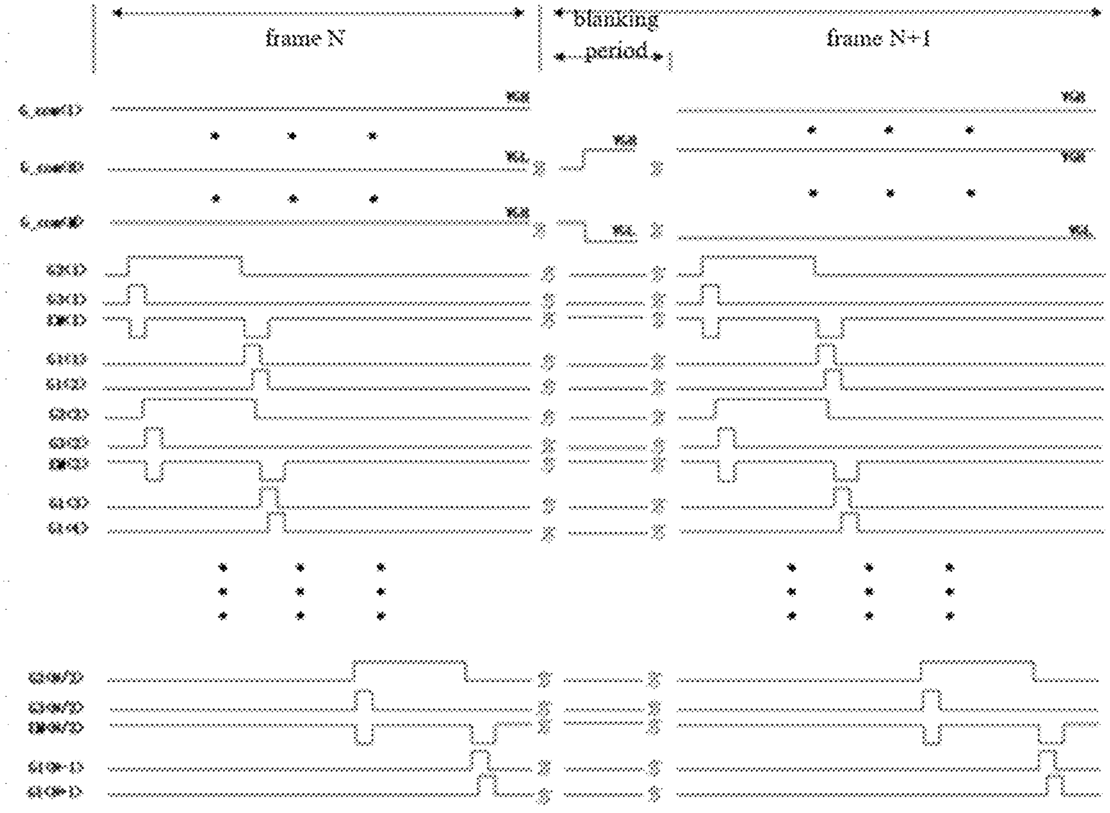
FIG. 4 is a driving timing diagram according to an embodiment of the present disclosure.

In more detail, as shown in FIG. 3 and FIG. 4, taking the display substrate including X control areas as an example.

In the N-frame display period: the control signals transmitted by the first area control line G_com<1> and the M-th area control line G_com<M> are all active level VGH, all the writing control transistors T_com included in the first control area corresponding to the first area control line G_com<1> are conductive, and all the writing control transistors T_com included in the M-th control area corresponding to the M-th area control line G_com<M> are conductive, which ensures that the first control area and the M-th control area are areas that can achieve normal refresh, and the high refresh operation of the first control area and the M-th control area can be achieved when the display substrate is scanned progressively. The control signal transmitted by the H-th area control line G_com<H> is a non-active level VGL, and all the writing control transistors T_com included in the H-th control area corresponding to the H-th area control line G_com<H> are cutoff, and when the display substrate is scanned progressively, the H-th control area can not achieve high refresh operation, so that the H-th control area does not refresh in frame N, and its display screen is not updated in frame N, providing the saved data to the high refresh area to achieve the effect of zone high refresh. It is worth noting that both M and H are positive integers greater than 1 and less than X.

During blanking period, zone selection is made for N+1 frame by controlling the level of control signals transmitted by the area control line G_com. It is worth noting that the blanking period is located at the beginning or end of each frame's display period.

In the N+1 frame display period: the control signals transmitted by the first area control line G_com<1> and the H-th area control line G_com<H> are all active level VGH, all the writing control transistors T_com included in the first control area corresponding to the first area control line G_com<1> are conductive, and all the writing control transistors T_com included in the H-th control area corresponding to the H-th area control line G_com<H> are conductive, which ensures that the first control area and the H-th control area are areas that can achieve normal refresh, and the high refresh operation of the first control area and the H-th control area can be achieved when the display substrate is scanned progressively. The control signal transmitted by the M-th area control line G_com<M> is a non-active level VGL, and all the writing control transistors T_com included in the M-th control area corresponding to the M-th area control line G_com<M> are cutoff, and when the display substrate is scanned progressively, the M-th control area can not achieve high refresh operation, so that the M-th control area does not refresh in frame M, and its display screen is not updated in frame M, providing the saved data to the high refresh area to achieve the effect of zone high refresh.

It is noted that considering the high load on the area control line G_com, it is possible to immediately adjust the control signal transmitted by the area control line G_com at the end of frame N and when entering the blanking period.

In the present embodiment, by setting the control area and the area control line G_com, the large-sized display substrate can also achieve a high refresh rate function of the display substrate.

It should be noted that the content within parentheses in FIG. 4 represents the number of rows, such as: G1<1> represents the first line of the first scan line, G2<1> represents the first line of the second scan line, G3<1> represents the first line of the third scan line, and EM<1> represents the first line of the light-emitting control line.

As shown in FIG. 3, FIG. 5, FIG. 8, FIG. 11, FIG. 15, FIG. 19 and FIG. 21, in some embodiments, the area control line G_com includes: a control bus 10 and at least one control branch line 11.

The control branch line 11 is coupled to the gates of each writing control transistor T_com included in a corresponding column of repeating unit column 2000 in the corresponding control area; the control bus 10 is coupled to at least one control branch line 11.

Exemplary, the control branch line 11 included in the area control line G_com corresponds one-to-one with the repeating unit column 2000 included in the control area corresponding to the area control line. The control branch line 11 is coupled to the gate of each writing control transistor T_com included in a corresponding column of repeating unit column 2000 in the corresponding control area, in order to control the conduction or cutoff of each writing control transistor T_com included in a corresponding column of repeating unit column 2000.

Exemplary, in the same area control line G_com, the control bus 10 and each control branch line 11 are respectively coupled. Exemplary, in the same area control line G_com, the control bus 10 and each control branch line 11 form an integrated structure.

Exemplary, the display substrate further includes a driving chip, the control bus 10 and the driving chip are located on the same side of the display substrate, the control bus 10 is coupled to the driving chip, receives the control signal provided by the driving chip, and transmits the received control signal to each control branch 11 that is coupled to it, and then controls whether the writing control transistors T_com in the corresponding control area conduction.

The display substrate provided by the above embodiment, by setting the area control line G_com including the control bus 10 and the control branch line 11, not only can better realize the transmission of the control signal, but also can reduce the layout difficulty of the area control line G_com, to ensure the reliability of the coupling between the area control line and the gates of the writing control transistors.

As shown in FIG. 3, FIG. 5, FIG. 8, FIG. 11, FIG. 15, FIG. 19 and FIG. 21, in some embodiments, the control branch line 11 includes: a first branch line 111 and a plurality of second branch lines 112; the second branch line 112 includes at least a portion extending along the first direction, and the plurality of second branch lines 112 are arranged in the second direction; the first branch line 111 includes at least a portion extending along the second direction, the first branch line 111 is coupled to the plurality of second branch lines 112, the first branch line 111 is coupled to the control bus 10; the first direction intersects with the second direction; the second branch line 112 is coupled to the gates of each writing control transistor T_com included in the corresponding repeating unit 1000.

Exemplary, the first direction includes a horizontal direction, and the second direction includes a vertical direction.

Exemplary, in the control area, the control branch line 11 corresponds one-to-one with the repeating unit column 2000, and the plurality of second branch lines 112 included in the control branch line 11 corresponds one-to-one with the plurality of repeating units 1000 included in the corresponding repeating unit column 2000. The repeating unit 1000 includes a plurality of subpixels arranged in the first direction, the subpixel includes a subpixel driving circuit, the subpixel driving circuit includes a writing control transistor T_com. The second branch line 112 is coupled to the gates of each writing control transistor T_com included in the corresponding repeating unit 1000. Exemplary, the second branch line 112 is coupled to the gates of the six writing control transistors T_com included in the corresponding repeating unit 1000, in order to control the conduction or cutoff of the six writing control transistors T_com.

Exemplary, the first branch line 111 included in the control branch line 11 is located in the middle area of the corresponding repeating unit column 2000, i.e., the number of subpixels located on both sides of the first branch line 111 along the first direction in the repeating unit column 2000 corresponding to the first branch line 111 is the same. For example: along the first direction, the number of subpixels located on the left and right sides of the corresponding first branch line 111 in the repeating unit 1000 is both three.

Exemplary, in the same control branch line 11, the orthogonal projection of the first branch line 111 on the base substrate form overlapping areas with the orthogonal projection of each second branch line 112 on the base substrate, the first branch line 111 is coupled to the corresponding second branch line 112 through a via in the corresponding overlapping area.

In the display substrate provided by the above embodiment, the control branch line 11 includes the first branch line 111 and the plurality of second branch lines 112, not only can the transmission of control signals be better achieved, but also the layout difficulty of the control branch line 11 can be reduced, ensuring the reliability of the coupling between the control branch line 11 and the gate of the writing control transistor T_com.

In some embodiments, in the same control area, the adjacent second branch lines 112 in the first direction are coupled with each other.

Exemplary, in the same control area, the second branch lines 112 located in the same row along the first direction are sequentially connected end-to-end. Exemplary, in the same control area, the second branch lines 112 located in the same row along the first direction form an integrated structure.

Exemplary, in adjacent control areas, the second branch lines 112 adjacent in the first direction are disconnected.

In the display substrate provided by the above embodiment, the adjacent second branch lines 112 in the first direction are coupled in the same control area, so that the control branch lines 11 can form a grid structure in the same control area, which is conducive to reducing the overall load of the area control line G_com and reducing the voltage drop of the area control line G_com.

In some embodiments, in the same control area, the adjacent second branch lines 112 in the first direction are independent from each other.

Figure 11:
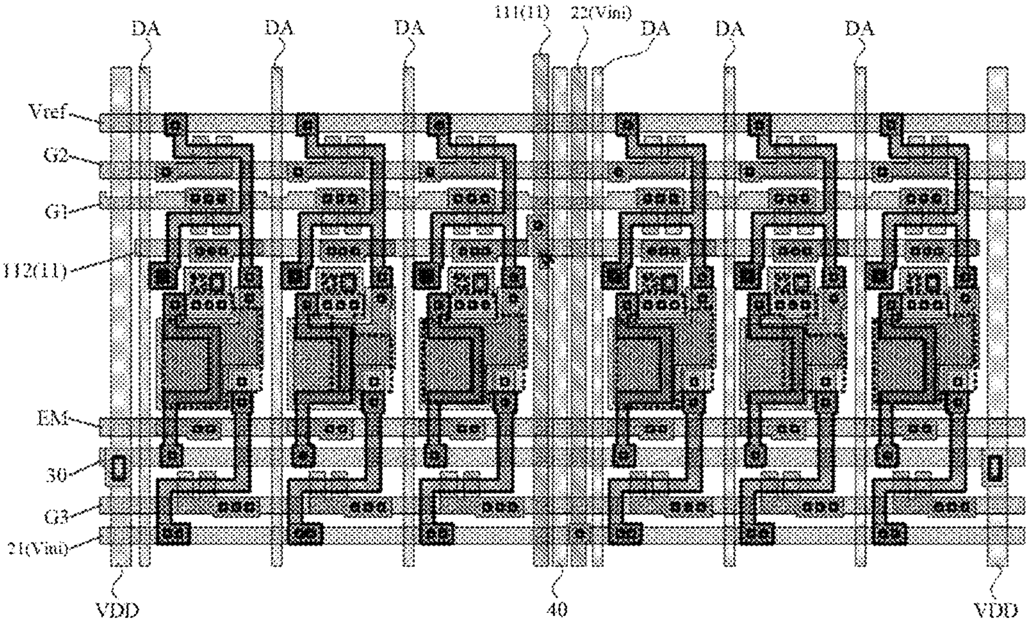
FIG. 11 is a layout diagram of adding a second source leakage metal layer to FIG. 8.

As shown in FIG. 11, in some embodiments, the display substrate further includes a plurality of power lines VDD, the orthographic projection of the second branch line 112 on the base substrate does not overlap with the orthographic projection of the power line VDD on the base substrate.

Exemplary, the plurality of power lines VDD are arranged along the first direction, and the power line VDD includes at least a portion extending along the second direction. Along the first direction, the power line VDD is alternately arranged with the repeating unit column 2000.

Exemplary, the display substrate further includes a plurality of power compensation lines 30, the plurality of power compensation lines 30 arranged along the second direction, the power compensation line 30 includes at least a portion extending along the first direction. The power compensation line 30 is coupled to the plurality of power lines VDD, and the power compensation line 30 and the power line VDD together form a grid structure to reduce the voltage drop of the power line VDD.

Exemplary, the orthographic projection of the power compensation line 30 on the base substrate has an overlapping area with the orthographic projection of the power line VDD on the base substrate, and the power compensation line 30 is coupled to the power line VDD through a via in the overlapping area In the display substrate provided by the above embodiment, the adjacent second branch lines 112 in the first direction is independent from each other, and the orthographic projection of the second branch line 112 on the base substrate does not overlap with the orthographic projection of the power line VDD on the base substrate, resulting in the control branch line 11 forming a non-grid structure and avoiding the power line VDD, not only can it reduce the risk of short circuits between the control branch line 11 and the power line VDD, but it also reduces the parasitic capacitance formed between the control branch line 11 and the power line VDD.

As shown in FIG. 11, in some embodiments, the orthographic projection of the data line DA on the base substrate and the orthographic projection of the second branch line 112 on the base substrate have a first overlapping area, and the area of the first overlapping areas formed by each data line DA is the same.

Exemplary, the data line DA and the subpixel column in the display substrate are alternately set in the first direction. The data line DA includes at least a portion extending along the second direction.

Exemplary, the data line DA and the second branch line 112 have different layer settings. The sum of the first overlapping areas formed between each data line DA and a plurality of second branch lines 112 is the same.

In the display substrate provided by the above embodiment, the sum of the first overlapping areas formed between each data line DA and a plurality of second branch lines 112 is the same, so that the load of the data line DA connected to various colored subpixels in the display substrate is the same, and better ensuring the uniformity of the display screen of the display substrate.

In some embodiments, the first branch line 111 is made of a first gate metal layer in the display substrate, and the second branch line 112 is made of a first source leakage metal layer in the display substrate.

Figure 24:
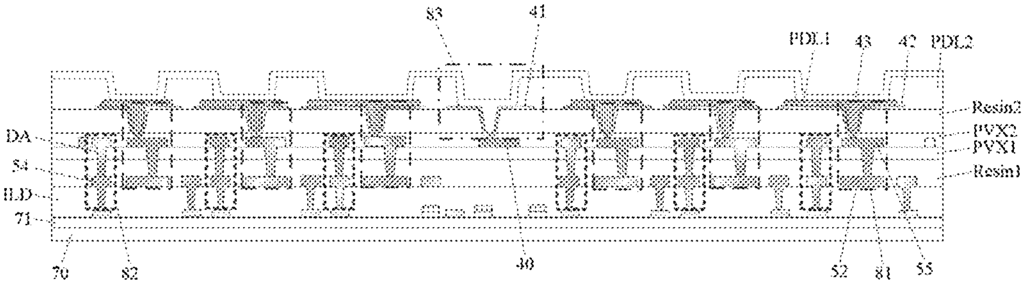
FIG. 24 is a schematic diagram of the cross-section along the A1A2 direction in FIG. 23.

As shown in FIG. 24, in some embodiments, the display substrate includes successively stacked on the base substrate 70 in the direction away from the base substrate 70: a buffer layer 71, an active layer, a first gate insulating layer, a first gate metal layer, a second gate insulating layer, a second gate metal layer, an interlayer insulating layer ILD, a first source leakage metal layer, a first organic layer Resin1, a first passivation layer PVX1, a second source leakage metal layer, a second passivation layer PVX2, a second organic layer Resin2, a first electrode layer 42, a first pixel definition layer PDL1, a second pixel definition layer PDL2, a light-emitting functional layer, a second electrode layer 43, an encapsulation layer. FIG. 24 also illustrates a first connection structure 81, a second connection structure 82 and a third connection structure 83. The second electrode layer 43 receives a negative power signal VSS.

In the display substrate provided by the above embodiment, the first branch line 111 is made of the first gate metal layer, enabling the first branch line 111 to be formed in the same composition process as other structures made of the first gate metal layer in the display substrate, thereby effectively simplifying the production process of the display substrate.

In the display substrate provided by the above embodiment, the second branch line 112 is made of the first source leakage metal layer, enabling the second branch line 112 can be formed in the same composition process as other structures made of the first source leakage metal layer in the display substrate, thereby effectively simplifying the production process of the display substrate.

In the display substrate provided by the above embodiment, the area control line G_com includes the control bus 10 and the control branch line 11, and the control branch line 11 includes the first branch line 111 and the plurality of second branch lines 112, so that the area control line G_com is designed in parallel inside the control area, with a smaller equivalent resistance, and the first branch line 111 is made of the first gate metal layer in the display substrate, the square resistance of the first gate metal layer is larger, which has little effect on parasitic resistance. Moreover, the first branch line 111 is made of the first gate metal layer in the display substrate, and the second branch line 112 is made of the first source leakage metal layer in the display substrate, which effectively reduces the parasitic capacitance formed between the area control line G_com and the structure made of the second source leakage metal layer, thereby optimizing the load of the area control line G_com and achieving the effect of zone control optimization.

As shown in FIG. 1, FIG. 5, FIG. 6, FIG. 7, FIG. 11, FIG. 15, FIG. 19 and FIG. 21, in some embodiments, the display substrate further includes: a plurality of first scan lines G1, a plurality of second scan lines G2, a plurality of third scan lines G3, a plurality of light-emitting control lines EM, power lines VDD, reference signal lines Vref and initialization signal lines *Vini*.

The subpixel driving circuit further includes: a compensation transistor T2, a reset transistor T3, a light-emitting control transistor T_em and a storage capacitor Cst.

The gate of the data writing transistor T1 is coupled to the corresponding first scan line G1.

The gate of the compensation transistor T2 is coupled to the corresponding second scan line G2, the first electrode of the compensation transistor T2 is coupled to the reference signal line Vref, and the second electrode of the compensation transistor T2 is coupled to the first electrode of the writing control transistor T_com.

The gate of the reset transistor T3 is coupled to the corresponding third scan line G3, the first electrode of the reset transistor T3 is coupled to the initialization signal line Vini, and the second electrode of the reset transistor T3 is coupled to the second electrode of the driving transistor DRT.

The gate of the light-emitting control transistor T_em is coupled to the corresponding light-emitting control line EM, the first electrode of the light-emitting control transistor T_em is coupled to the power line VDD, and the second electrode of the light-emitting control transistor T_em is coupled to the first electrode of the driving transistor DRT.

The first plate Cst1 of the storage capacitor Cst is coupled to the gate of the driving transistor DRT, and the second plate Cst2 of the storage capacitor Cst is coupled to the second electrode of the driving transistor DRT.

Exemplary, the initialization signal line *Vini* includes a plurality of first initial portions 21 and a plurality of second initial portions 22, the plurality of first initial portions 21 arranged along the second direction, the plurality of second initial portions 22 arranged along the first direction, the first initial portion 21 includes at least a portion extending along the first direction, the second initial portion 22 includes at least a portion extending along the second direction, the first initial portion 21 is coupled to each second initial portion 22, forming a grid structure for the initialization signal line *Vini*, thereby effectively reducing the voltage drop of the initialization signal line *Vini*.

Figure 5:
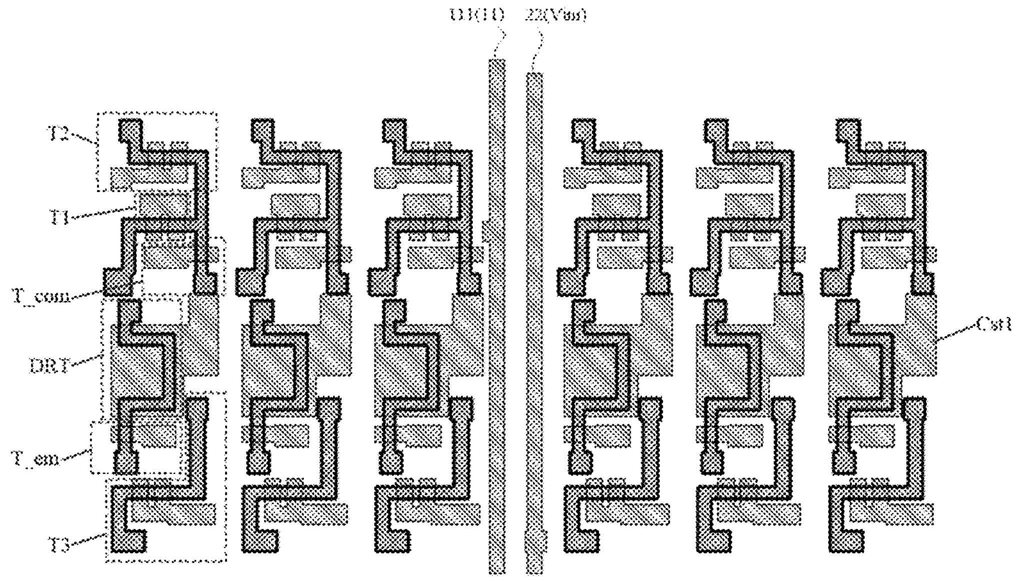
FIG. 5 is a layout diagram of the active layer and the first gate metal layer of the repeating unit according to an embodiment of the present disclosure.
Figure 6:
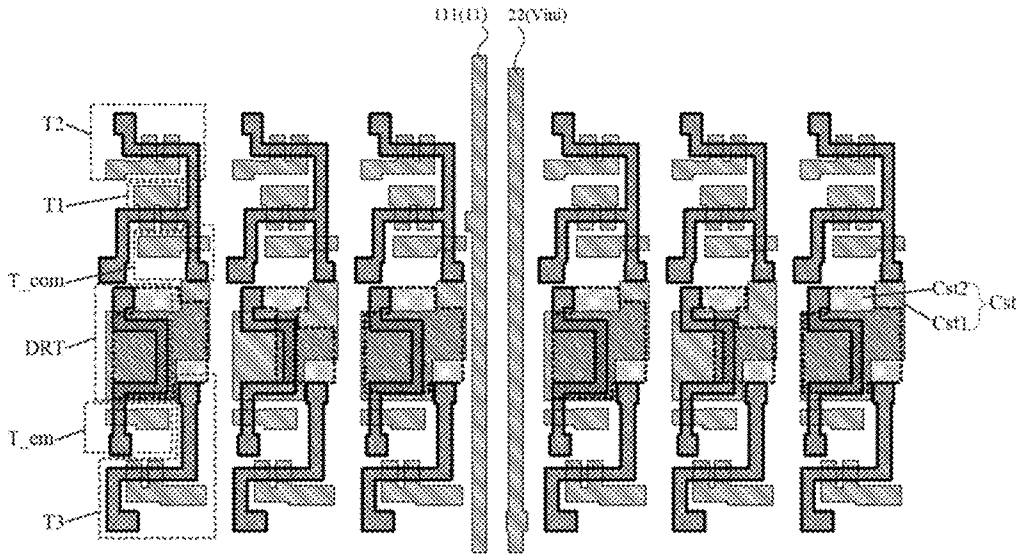
FIG. 6 is a layout diagram of adding a second gate metal layer to FIG. 5.

As shown in FIG. 5, exemplary, the active layer is configured to form the channel portion, first electrode, and second electrode included in each transistor.

As shown in FIG. 5, exemplary, the first gate metal layer is configured to form the gates of each transistor, the first branch line 111 and the second initial portion 22.

Figure 7:
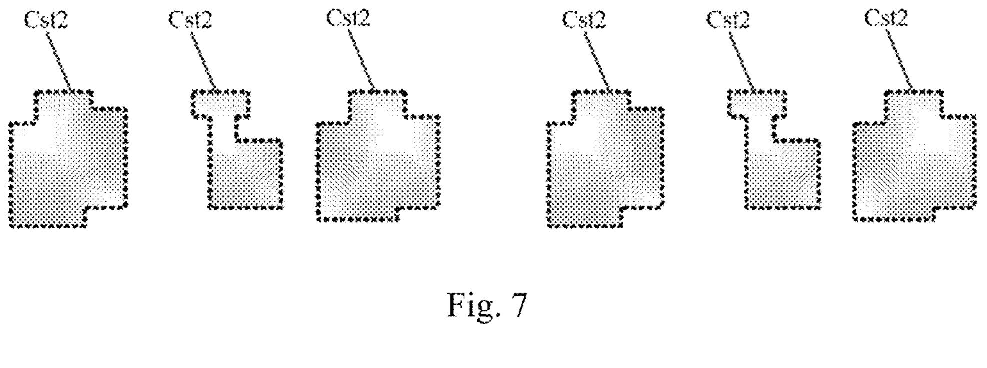
FIG. 7 is a layout diagram of the second gate metal layer in FIG. 6.
Figure 8:
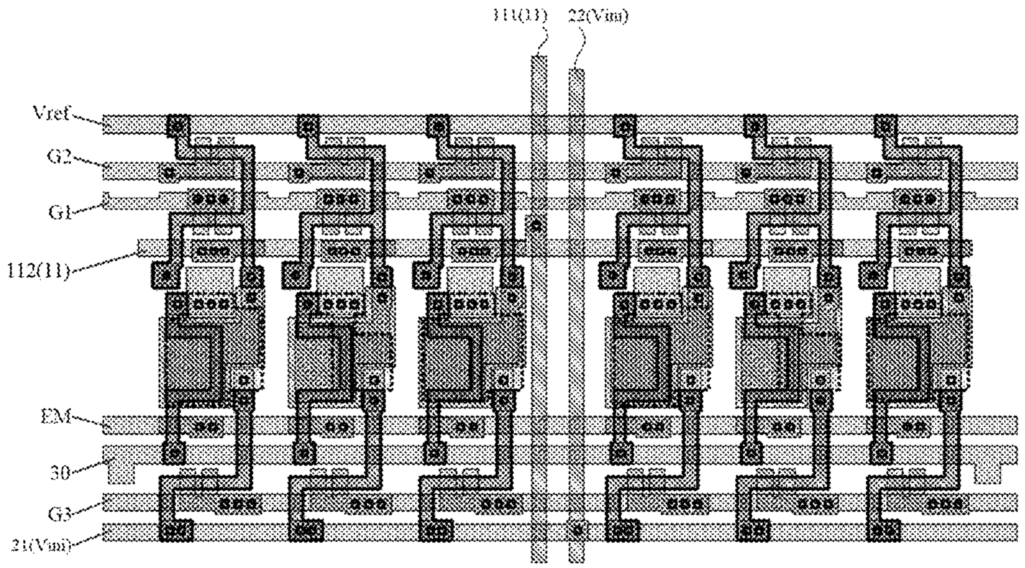
FIG. 8 is a layout diagram of adding a first source leakage metal layer to FIG. 6.

As shown in FIG. 7, exemplary, the second gate metal layer is used for the second plate of the storage capacitor Cst.

Figure 10:
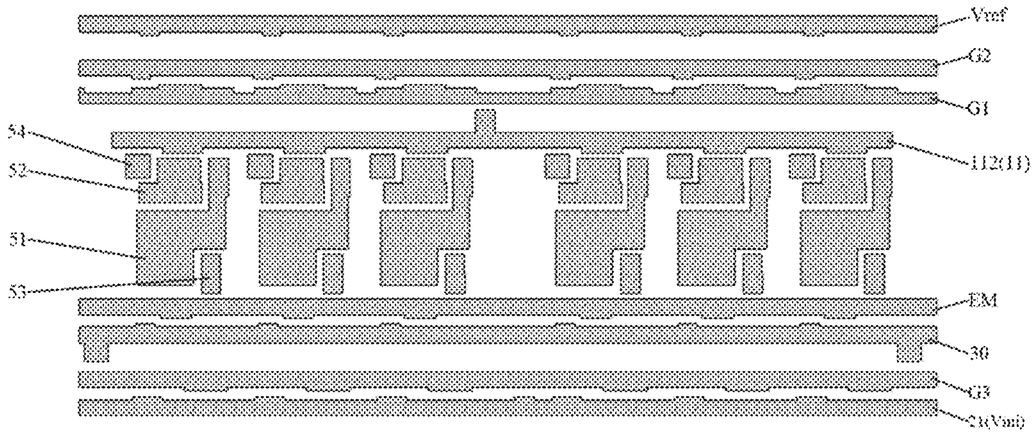
FIG. 10 is a layout diagram of the first source leakage metal layer in FIG. 8.

As shown in FIG. 10, exemplary, the first source leakage metal layer is configured to form some conductive connection portion, the reference signal line Vref, the first scan line G1, the second scan line G2, the third scan line G3, the light-emitting control line EM and the first initial portion 21. The reference signal line Vref, the second scan line G2, the first scan line G1, the second branch line 112, the light-emitting control line EM, the power compensation line 30, the third scan line G3 and the first initial portion 21 coupled to the same repeating unit 1000 are respectively arranged along the second direction.

Exemplary, the reference signal line Vref, the first scan line G1, the second scan line G2, the third scan line G3 and the light-emitting control line EM all include at least a portion extending along the first direction.

Figure 14:
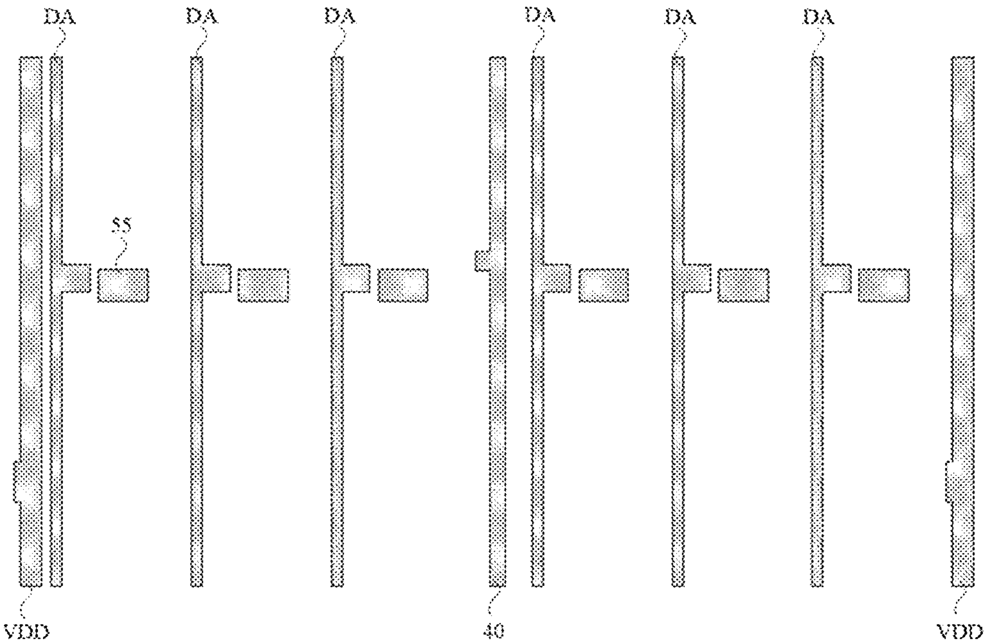
FIG. 14 is a layout diagram of the second source leakage metal layer in FIG. 11.
Figure 15:
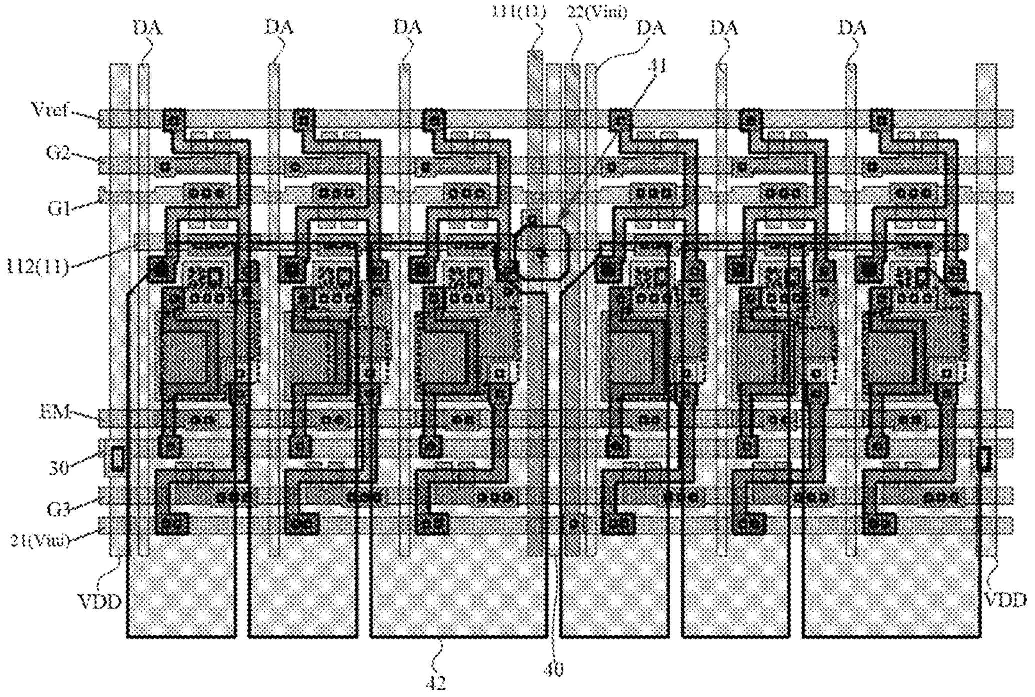
FIG. 15 is a layout diagram of adding a first electrode layer to FIG. 11.

As shown in FIG. 14, exemplary, the second source leakage metal layer is configured to form the power line VDD, the data line DA, some conductive connection portions and auxiliary electrodes 40. Exemplary, the auxiliary electrode 40 includes at least a portion extending along the second direction, the auxiliary electrode 40 is coupled to the second electrode layer by a connection pattern 41 made of indium tin oxide material, thereby effectively reducing the voltage drop of the second electrode layer.

As shown in FIG. 1, exemplary, the subpixel driving circuit includes: data writing transistor T1, writing control transistor T_com, driving transistor DRT, compensation transistor T2, reset transistor T3, light-emitting control transistor T_em, storage capacitance Cst, and intrinsic capacitance C1 of light-emitting element EL.

Figure 9:
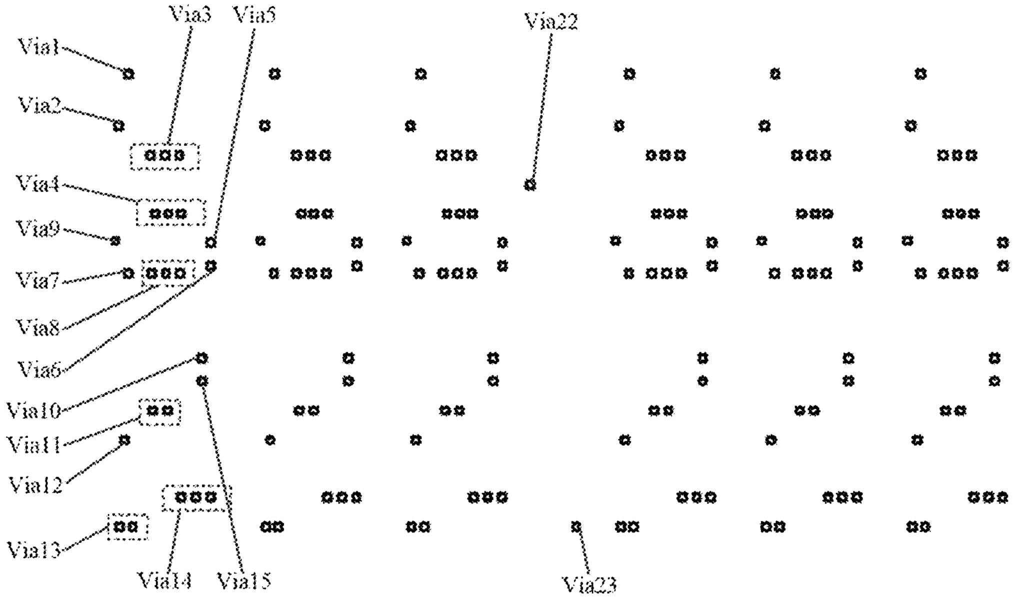
FIG. 9 is a layout diagram of the vias formed on the interlayer insulation layer in FIG. 8.

As shown in FIG. 9, vias formed on the interlayer insulation layer are shown. As shown in FIG. 5 to FIG. 10, the gate of the compensation transistor T2 is coupled to the corresponding second scan line G2 via the second via Via2, and the first electrode of the compensation transistor T2 is coupled to the reference signal line Vref via the first via Via1.

The gate of the data writing transistor T1 is coupled to the corresponding first scan line G1 via the third via Via3. The first electrode of the data writing transistor T1 is coupled to the fourth conductive connection portion 54 via the ninth via Via9.

The gate of the writing control transistor T_com is coupled to the area control line G corn via the fourth via Via4, the second electrode of the writing control transistor T_com is coupled to the first conductive connection portion 51 via the fifth via Via5, the first conductive connection portion 51 is coupled to the gate of the driving transistor DRT via the sixth via Via6, and the gate of the driving transistor DRT is also used as the first plate Cst1 of the storage capacitor Cst.

The second electrode of the driving transistor DRT is coupled to the second conductive connection portion 52 via the seventh via Via7. The second conductive connection portion 52 is coupled to the second plate Cst2 of the storage capacitor Cst via the eighth via Via8. The second plate Cst2 of the storage capacitor Cst is coupled to the third conductive connection portion 53 via the tenth via Via10, and the third conductive connection portion 53 is coupled to the second electrode of the reset transistor T3 via the fifteenth via Via15.

The gate of the light-emitting control transistor T_em is coupled to the corresponding light-emitting control line EM via the eleventh via Vial1, and the first electrode of the light-emitting control transistor T_em is coupled to the power line VDD through the twelfth via Via12.

The gate of the reset transistor T3 is coupled to the third scan line G3 via the fourteenth via Vial4, and the first electrode of the reset transistor T3 is coupled to the first initial portion 21 via the thirteenth via Vial3.

The first branch line 111 is coupled to the second branch line 112 via the twenty-second via Via22. The first initial portion 21 is coupled to the second initial portion 22 via the twenty-third via Via23.

Figure 12:
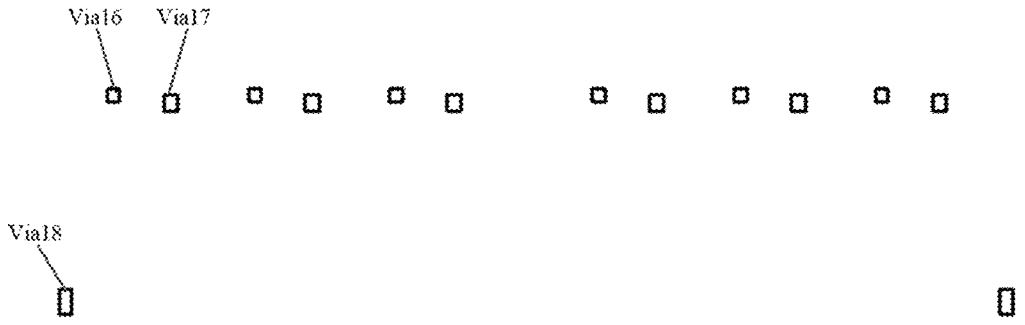
FIG. 12 is a layout diagram of the vias formed on the first organic layer in FIG. 11.
Figure 13:
FIG. 13 is a layout diagram of the vias formed on the first passivation layer in FIG. 11.

As shown in FIG. 12, vias formed on the first organic layer are shown. As shown in FIG. 13, vias formed on the first passivation layer are shown.

As shown in FIG. 11 to FIG. 14, the second conductive connection portion 52 is coupled to the fifth conductive connection portion 55 sequentially via the seventeenth via Vial7 and the twentieth via Via20. The fourth conductive connection portion 54 is coupled to the data line DA sequentially via the sixteenth via Vial6 and the nineteenth via Vial9. The power compensation line 30 is coupled to the power line VDD via the eighteenth via Vial8 and the twenty-first via Via21 at once.

Figure 16:
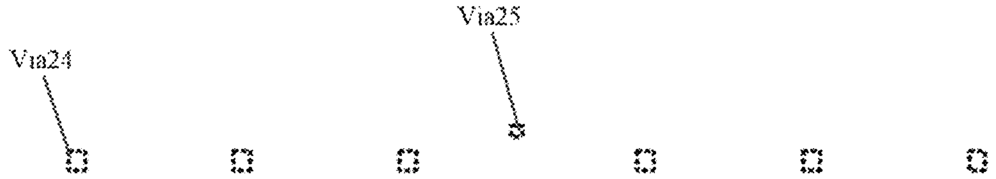
FIG. 16 is a layout diagram of the vias formed on the second passivation layer in FIG. 15.
Figure 17:
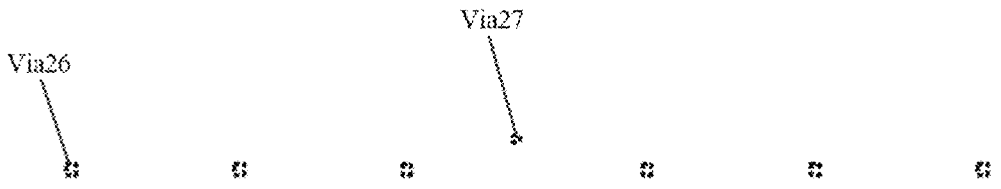
FIG. 17 is a layout diagram of the vias formed on the second organic layer in FIG. 15.
Figure 18:
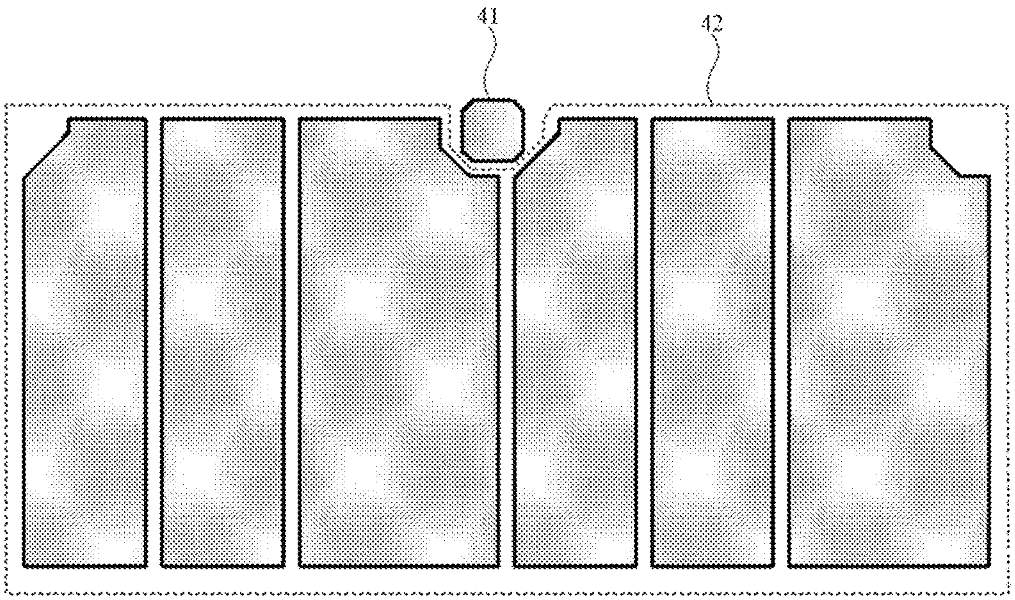
FIG. 18 is a layout diagram of the first electrode layer in FIG. 15.
Figure 19:
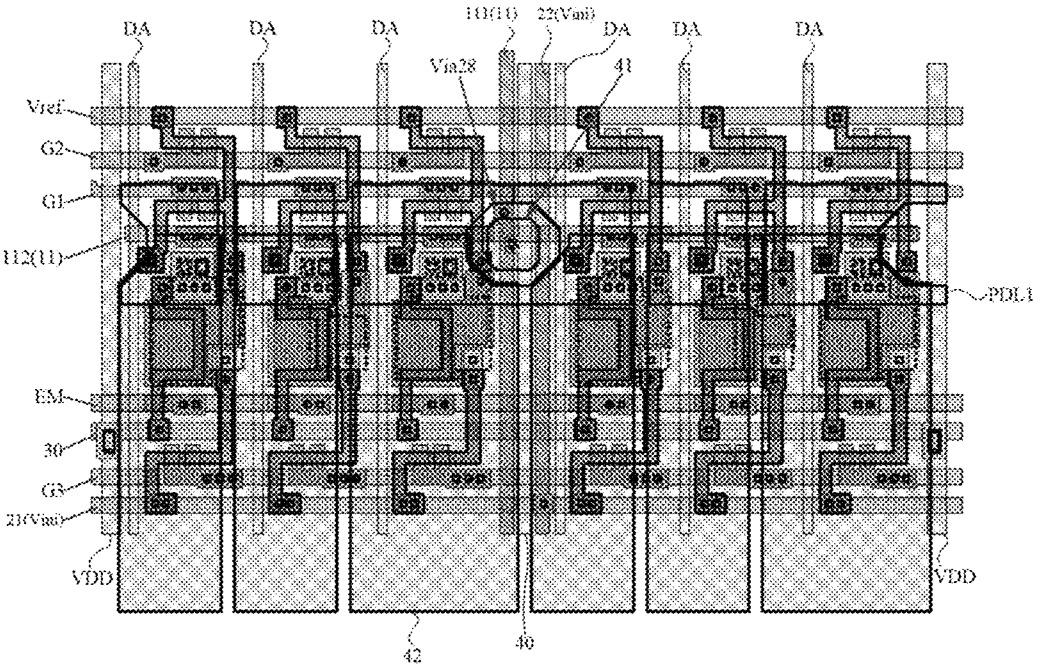
FIG. 19 is a layout diagram of adding a first pixel definition layer to FIG. 15.
Figure 20:
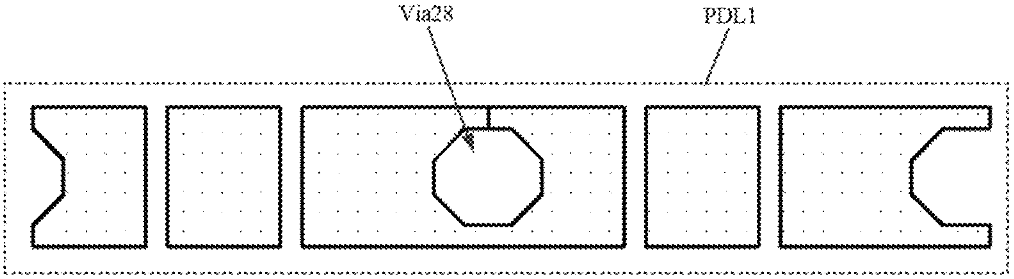
FIG. 20 is a layout diagram of the first pixel definition layer in FIG. 19.

As shown in FIG. 16, vias formed on the second passivation layer are shown. As shown in FIG. 17, vias formed on the second organic layer are shown.

As shown in FIG. 15 to FIG. 22, the fifth conductive connection portion 55 is coupled to the corresponding first electrode in the first electrode layer 42 sequentially via the twenty-fourth via Via24 and the twenty-sixth via Via26. The auxiliary electrode 40 is coupled to the connection pattern 41 sequentially via the twenty-fifth via Via 25 and the twenty-seventh via Via27. Connection pattern 41 is coupled to the second electrode layer sequentially via the twenty-eighth via Via28 and the twenty-ninth via Via29.

Figure 23:
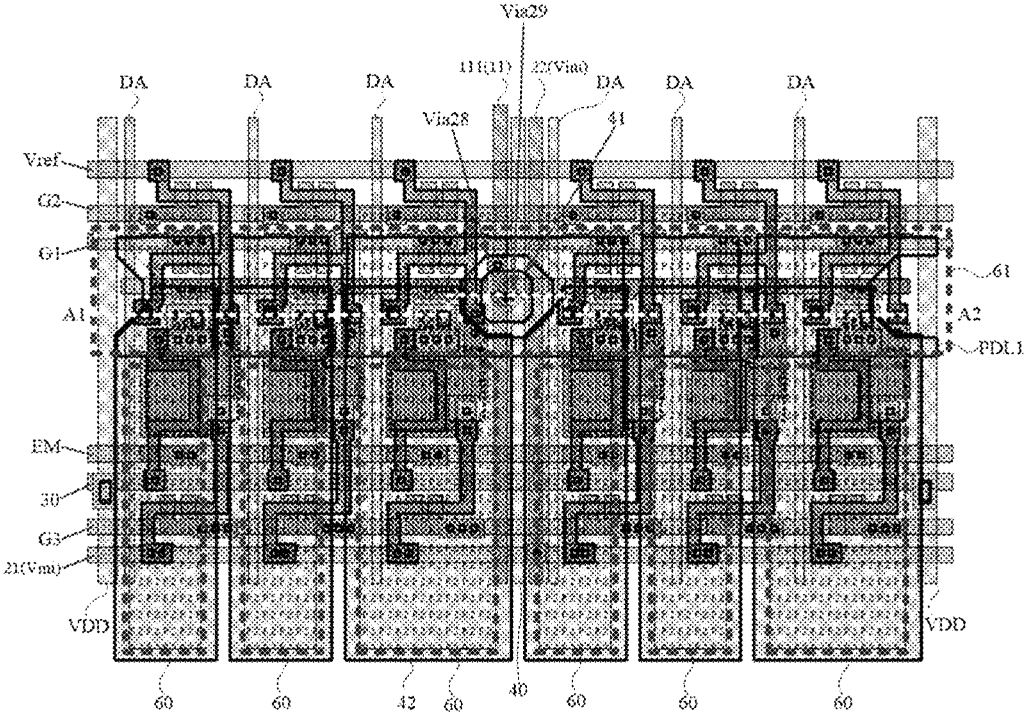
FIG. 23 is a layout diagram of adding a second pixel definition layer opening to FIG. 19.

As shown in FIG. 23, the opening area 60 of the pixel and the non-opening area 61 located near the opening area 60 are shown.

As shown in FIG. 1, in some embodiments, the data writing transistor T1, the compensation transistor T2 and the reset transistor T3 all include a double-gate structure, which can effectively reduce the leakage current.

As shown in FIG. 1, in some embodiments, the writing control transistor T_com includes a single-gate structure.

Since the data writing transistor T1 is connected between the data line DA and the writing control transistor T_com, when the writing control transistor is turned off, the leakage path of the data writing transistor T1 is turned off. The writing control transistor T_com adopts a single-gate structure design, which is conducive to saving the layout area.

The present embodiment also provides a driving method for a displaying substrate for driving the display substrate provided by the above embodiment, the driving method includes:

In the N-frame display period, the zone control signals transmitted by at least part of the multiple area control lines G_com in the display substrate are at an active level, and the writing control transistors T_com coupled to at least part of the area control lines G_com are conductive to perform progressive scanning of the plurality of subpixels to achieve progressive writing of data signals.

In the N+1 frame display period, the level of the zone control signals transmitted by the plurality of area control lines G_com change, so that the writing control transistor T_com coupled to the area control line for transmitting zone control signals with active level is conductive, and the plurality of subpixels is scanned progressively to achieve progressive writing of data signals.

Taking the display substrate including X control areas as an example.

Exemplary, in the N-frame display period, the control signals transmitted by the first area control line G_com<1> and the M-th area control line G_com<M> are all active level VGH, all the writing control transistors T_com included in the first control area corresponding to the first area control line G_com<1> are conductive, and all the writing control transistors T_com included in the M-th control area corresponding to the M-th area control line G_com<M> are conductive, which ensures that the first control area and the M-th control area are areas that can achieve normal refresh, and the high refresh operation of the first control area and the M-th control area can be achieved when the display substrate is scanned progressively. In the N+1 frame display period, the level of the zone control signals transmitted by the plurality of area control lines G_com change, causing the control signals transmitted by the first area control line G_com<1> and the H-th area control line G_com<H> to be all active level VGH, all the writing control transistors T_com included in the first control area corresponding to the first area control line G_com<1> are conductive, and all the writing control transistors T_com included in the H-th control area corresponding to the H-th area control line G_com<H> are conductive, which ensures that the first control area and the H-th control area are areas that can achieve normal refresh, and the high refresh operation of the first control area and the H-th control area can be achieved when the display substrate is scanned progressively.

When the display substrate is scanned progressively to write the data signal, every two-line subpixel driving circuits or every four-line subpixel driving circuits can be controlled according to actual needs to achieve reset and compensation at the same time.

When using the driving method provided in the present embodiment to drive the display substrate, through each area control line G_com can control whether all the writing control transistors T_com in the corresponding control area are conductive, so as to achieve the effect of controlling whether the area achieves a high refresh rate, so that the large-size display substrate can also well achieve the high refresh rate function of the display substrate.

In some embodiments, the driving method further includes:

a blanking period, which is located at the beginning or end of each frame's display period; during the blanking period, the levels of the zone control signals transmitted by the plurality of area control lines are adjusted.

Exemplary, at the end of frame N, when the blanking period of frame N+1 is entered, the control signal transmitted by the area control line G_com is immediately adjusted.

The present embodiment also provides a display device, including a display substrate provided by the above embodiment.

It should be noted that the display device may be: TV, monitor, digital photo frame, mobile phone, tablet computer and other products or components with display functions, wherein the display device further includes a flexible circuit board, a printed circuit board and a backboard.

Exemplary, the display device includes an organic light-emitting diode display device, but not limited to this.

The display substrate provided by the above embodiment includes a plurality of control areas. Each control area includes at least one column of repeating unit column 2000, the area control line is coupled to the gates of the writing control transistors included in each repeating unit column 2000 in the corresponding control area. By controlling each area control line G_com, it is possible to control whether all writing control transistors T_com in the corresponding control area are conductive, in order to achieve the effect of controlling whether the area achieves a high refresh rate. In the display substrate provided by the above embodiment, by setting the control area and the area control line, the large-sized display substrate can also achieve a high refresh rate function of the display substrate.

The display device provided by the present embodiment also has the above beneficial effect when including the above display substrate, which will not be repeated herein.

Since medium and large size display products are limited by large loads, they cannot well realize the product function of high refresh rate, so it is necessary to add metal layers and thicker insulation layers for wiring to reduce the impact of loads. The addition of a thicker insulation layer requires the formation of a deeper via on the insulation layer, which will affect the flatness of the light-emitting functional layer, which further reduces the opening rate of the display product and affects the life of the display product.

Referring to FIG. 1, FIG. 2, FIG. 5, FIG. 23 and FIG. 24, the present embodiment provides a display substrate, including: a base substrate, and a plurality of data lines DA and a plurality of subpixels disposed on the base substrate; the subpixel includes a subpixel driving circuit and a light-emitting element EL; the subpixel driving circuit includes a driving transistor DRT and a data writing transistor T1, and the light-emitting element EL includes a first electrode.

The second electrode of the driving transistor DRT is coupled to the corresponding first electrode by a first connection structure 81; the first electrode of the data writing transistor T1 is coupled to the corresponding data line DA by a second connection structure 82.

The first connection structure 81 and the second connection structure 82 are both located in the non-opening area 61 of the sub-pixel, the orthographic projection of the first connection structure 81 on the base substrate and the orthographic projection of the second connection structure 82 on the base substrate are arranged in the first direction.

The orthographic projection of the second connection structure 82 on the base substrate and the opening area 60 of the subpixel are arranged in the second direction, and the second direction intersects with the first direction.

Exemplary, the plurality of data lines DA is arranged in the first direction, and the data line DA includes at least a portion extending along the second direction. The plurality of subpixels is distributed in arrays, the plurality of subpixels is divided into multiple subpixels columns, and the subpixels included in each subpixel column are coupled to the corresponding data line DA.

Exemplary, the subpixel includes a subpixel driving circuit and a light-emitting element, the subpixel driving circuit is coupled to the first electrode included in the light-emitting element for providing a driving signal to the first electrode of the light-emitting element to drive the light-emitting element to emit light.

Exemplary, the data line DA and the first electrode are both located on the side of the subpixel driving circuit away from the base substrate. There is a thicker insulation layer between the data line DA and the first electrode of the data writing transistor T1, and there is also a thicker insulation layer between the first electrode and the second electrode of the driving transistor DRT, therefore, the first connection structure 81 and the second connection structure 82 both include a deeper via structure.

According to the specific structure of the above display substrate, in the display substrate provided by the present embodiment, the first connection structure 81 and the second connection structure 82 are located in the non-opening area of the subpixel, avoiding the occupation of space in the opening area by the first connection structure 81 and the second connection structure 82, ensuring the opening rate of the display substrate, avoiding the impact of the first connection structure 81 and the second connection structure 82 on the flatness of the light-emitting element.

Moreover, in the display substrate provided by the present embodiment, the orthographic projection of the first connection structure 81 on the base substrate and the orthographic projection of the second connection structure 82 on the base substrate are arranged in the first direction; the orthographic projection of the second connection structure 82 on the base substrate and the opening area of the subpixel are arranged in the second direction, so that the first connection structure 81 and the second connection structure 82 are located on the same side along the second direction of the opening area, and such that the first connection structure 81 and the second connection structure 82 occupy a small space in the second direction, and can centrally block the first connection structure 81 and the second connection structure 82, so that the size of the opening area in the second direction can be optimized, effectively improving the opening rate of the display substrate and improving the service life of the display substrate.

As shown in FIG. 8 to FIG. 18, FIG. 23 and FIG. 24, in some embodiments, the first connection structure 81 includes: a second conductive connection portion 52, a first via structure, a fifth conductive connection portion 55 and a second via structure.

The second conductive connection portion 52 is coupled to the second electrode of the driving transistor DRT, the second conductive connection portion 52 is coupled to the fifth conductive connection portion 55 by the first via structure, and the fifth conductive connection portion 55 is coupled to the corresponding first electrode (the first electrode layer 42 includes a plurality of first electrodes) by the second via structure.

Exemplary, the first via structure includes a seventeenth via Via17 and a twentieth via Via20. The second via structure includes a twenty-fourth via Via24 and a twenty-sixth via Via26. The second conductive connection portion 52 is made of a first source leakage metal layer in the display substrate, and the fifth conductive connection portion 55 is made of a second source leakage metal layer in the display substrate.

As shown in FIG. 8 to FIG. 18, FIG. 23 and FIG. 24, in some embodiments, the second connection structure 82 includes: a fourth conductive connection portion 54 and a third via structure. The fourth conductive connection portion 54 is coupled to the first electrode of the data writing transistor T1, and the fourth conductive connection portion 54 is coupled to the corresponding data line DA by the third via structure.

Exemplary, the third via structure includes a sixteenth via Via16 and a nineteenth via Via19. The fourth conductive connection portion 54 is made of a first source leakage metal layer in the display substrate.

As shown in FIG. 24, in some embodiments, the display substrate includes successively stacked on the base substrate 70 in the direction away from the base substrate 70: a buffer layer 71, an active layer, a first gate insulating layer, a first gate metal layer, a second gate insulating layer, a second gate metal layer, an interlayer insulation layer ILD, a first source leakage metal layer, a first organic layer Resin1, a first passivation layer PVX1, a second source leakage metal layer, a second passivation layer PVX2, a second organic layer Resin2, a first electrode layer 42, a first pixel definition layer PDL1, a second pixel definition layer PDL2, a light-emitting functional layer, a second electrode layer 43, an encapsulation layer. The second electrode layer 43 receives a negative power signal VSS.

As shown in FIG. 8 to FIG. 18, FIG. 23 and FIG. 24, in some embodiments, the display substrate further includes a first organic layer and a second organic layer stacked sequentially in the direction away from the base substrate, the first via structure runs through the first organic layer, and the second via structure runs through the second organic layer.

The second conductive connection portion 52 is located between the first organic layer and the base substrate, and the fifth conductive connection portion 55 is located between the first organic layer and the second organic layer.

The first organic layer and the second organic layer are thicker insulating layers, so the first via structure and the second via structure are both deeper via structures. The first connection structure 81 is located in the non-opening area of the subpixel, so that the first via structure and the second via structure are located in the non-open area, avoiding the space occupied by the first via structure and the second via structure, ensuring the opening rate of the display substrate, and avoiding the impact of the first via structure and the second via structure on the flatness of the light-emitting element.

As shown in FIG. 8 to FIG. 18, FIG. 23 and FIG. 24, in some embodiments, the third via structure runs through the first organic layer, and the fourth conductive connection portion 54 is located between the first organic layer and the base substrate.

The first organic layer is a thicker insulating layer, so the third via structure is a deeper via structure. The second connection structure 82 is located in the non-opening area of the subpixel, so that the third via structure is located in the non-opening area, avoiding the space occupied by the third via structure in the opening area, ensuring the opening rate of the display substrate, and avoiding the impact of the third via structure on the flatness of the light-emitting element.

In the display substrate provided by the above embodiment, the orthographic projection of the first connection structure 81 on the base substrate and the orthographic projection of the second connection structure 82 on the base substrate are arranged in the first direction, and the orthographic projection of the second connection structure 82 on the base substrate and the opening area of the subpixel are arranged in the second direction, such that the orthographic projection of the first via structure on the base substrate, the orthographic projection of the second via structure on the base substrate, and the orthographic projection of the third via structure on the base substrate are all located on the same side along the second direction of the opening area, and such that the first via structure, the second via structure and the third via structure occupy a small space in the second direction, so that the size of the opening area in the second direction can be optimized, effectively improving the opening rate of the display substrate and improving the service life of the display substrate.

As shown in FIG. 8 to FIG. 18, FIG. 23 and FIG. 24, in some embodiments, the display substrate further includes: a first passivation layer and a second passivation layer. The first passivation layer is located between the first organic layer and the second passivation layer, and the second passivation layer is located between the first passivation layer and the second organic layer.

The first via structure and the third via structure both run through the first passivation layer, and the second via structure runs through the second passivation layer. The fifth conductive connection portion 55 is located between the first passivation layer and the second passivation layer.

In the display substrate provided by the above embodiment, the display substrate further includes the first passivation layer and the second passivation layer, and the fifth conductive connection portion 55 is located between the first passivation layer and the second passivation layer, which can better ensure the conductivity of the fifth conductive connection portion 55.

As shown in FIG. 8 to FIG. 18, FIG. 23 and FIG. 24, in some embodiments, the display substrate further includes: an auxiliary electrode 40, a third connection structure 83 and a second electrode layer 43. The auxiliary electrode 40 is coupled to the second electrode layer 43 by the third connection structure 83.

The third connection structure 83 is located in the non-opening area 61 of the subpixel. The orthographic projection of the third connection structure 83 on the base substrate and the orthographic projection of the first connection structure 81 on the base substrate are arranged in the first direction.

Exemplary, the plurality of auxiliary electrodes 40 included in the display substrate is arranged along the first direction. The auxiliary electrode 40 includes at least a portion extending along the second direction.

Exemplary, there is a thicker insulation layer between the auxiliary electrode 40 and the second electrode layer, and the third connection structure 83 includes a deeper via structure capable of penetrating the thicker insulation layer.

In the display substrate provided by the above embodiment, the third connection structure 83 is located in the non-opening area 61 of the subpixel, avoiding the third connection structure 83 from occupying the space of the opening area 60, ensuring the opening rate of the display substrate, and avoiding the impact of the third connection structure 83 on the flatness of the light-emitting element.

Moreover, in the display substrate provided by the above embodiment, the orthographic projection of the third connection structure 83 on the base substrate and the orthographic projection of the first connection structure 81 on the base substrate are arranged in the first direction, such that the first connection structure 81 and the third connection structure 83 are both located on the same side along the second direction in the opening area 60, and such that the first connection structure 81 and the third connection structure 83 occupy a small space in the second direction. Thus, the size of the opening area 60 in the second direction can be optimized, effectively improving the opening rate of the display substrate, and improving the service life of the display substrate.

As shown in FIG. 8 to FIG. 18, FIG. 23 and FIG. 24, in some embodiments, the display substrate further includes: an auxiliary electrode 40, a third connection structure 83 and a second electrode layer. The auxiliary electrode 40 is coupled to the second electrode layer 43 by the third connection structure 83.

The third connection structure 83 is located in the non-opening area of the subpixel, the orthographic projection of the third connection structure 83 on the base substrate and the orthographic projection of the first connection structure 81 on the base substrate are at least partially staggered.

In the display substrate provided by the above embodiment, the orthographic projection of the third connection structure 83 on the base substrate and the orthographic projection of the first connection structure 81 on the base substrate are at least partially staggered, which can better utilize the layout space of the non-opening area, reduce the layout difficulty of the first connection structure 81 and the third connection structure 83.

As shown in FIG. 8 to FIG. 18, FIG. 23 and FIG. 24, in some embodiments, the display substrate further includes a second organic layer and a pixel definition layer stacked sequentially in the direction away from the base substrate.

The third connection structure 83 includes: a fourth via structure, a connection pattern 41 and a fifth via structure. The auxiliary electrode 40 is located between the second organic layer and the base substrate. At least part of the second electrode layer is located on the side of the pixel definition layer away from the base substrate, at least part of the connection pattern 41 is located between the second organic layer and the pixel definition layer. The fourth vial structure runs through the second organic layer, and the fifth via structure runs through the pixel definition layer.

The connection pattern 41 is coupled to the auxiliary electrode 40 by the fourth via structure, and the connection pattern 41 is coupled to the second electrode layer by the fifth via structure.

Exemplary, the pixel definition layer includes a first pixel definition layer and a second pixel definition layer arranged in layers, the first pixel definition layer is located between the base substrate and the second pixel definition layer. At least part of the second electrode layer is located on the side of the second pixel definition layer away from the base substrate, and at least part of the connection pattern 41 is located between the second organic layer and the first pixel definition layer.

Exemplary, the fourth via structure includes a twenty-fifth via Via25 and a twenty-seventh via Via27. The fifth via structure includes a twenty-eighth via Via28 and a twenty-ninth via Via29.

Exemplary, the connection pattern 41 and the first electrode layer 42 is provided in the same layer. Exemplary, the connection pattern 41 can be made of the same material as the first electrode layer, such as indium tin oxide material, or different materials can be configured to meet the performance of conductive connection.

In the display substrate provided by the above embodiment, the second electrode layer is coupled to the plurality of auxiliary electrodes 40 by the connection pattern 41, effectively reducing the voltage drop of the second electrode layer.

Figure 21:
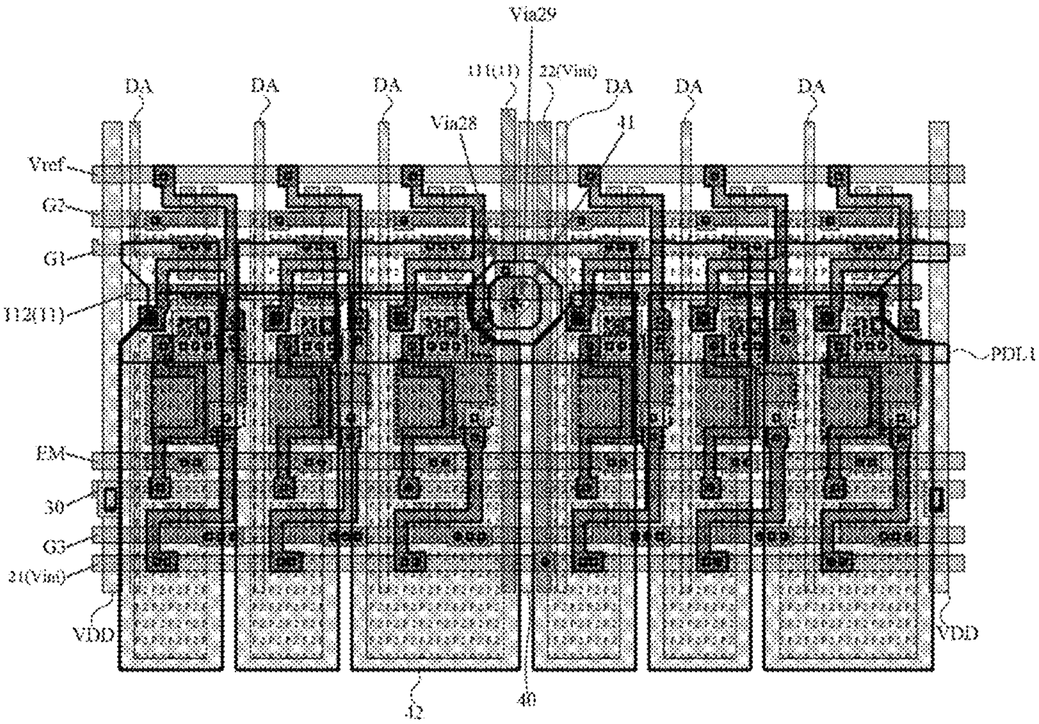
FIG. 21 is a layout diagram of adding a second pixel definition layer opening to FIG. 19.
Figure 22:
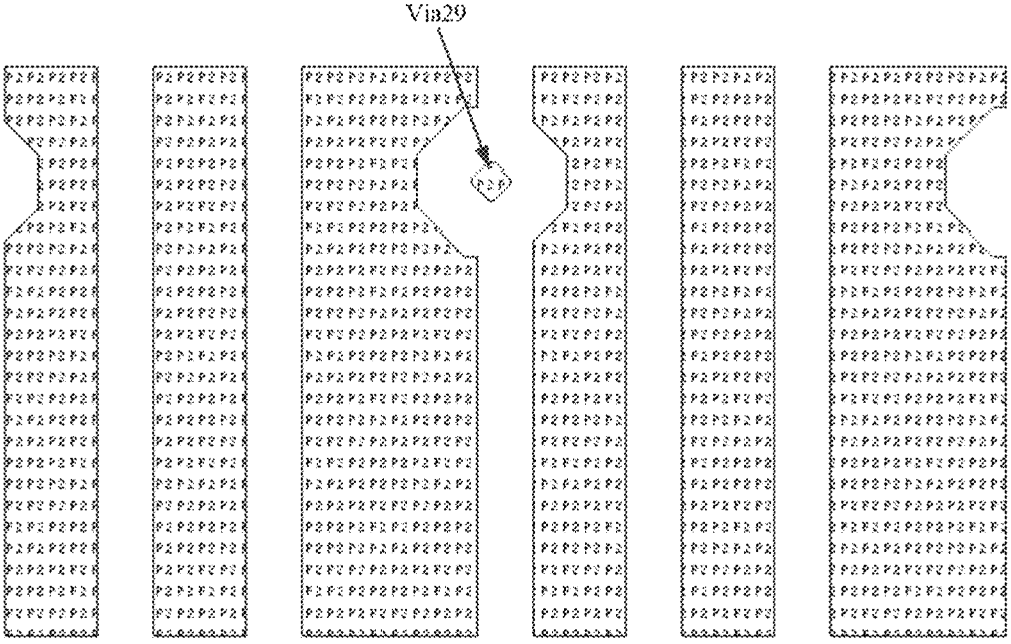
FIG. 22 is a layout diagram of the second pixel definition layer opening in FIG. 21.

As shown in FIG. 21, in some embodiments, the plurality of subpixels is divided into a plurality of repeating units 1000 distributed in arrays, each repeating unit 1000 includes two subunits arranged in the first direction, each subunit includes a plurality of subpixels arranged in the first direction.

The orthographic projection of the auxiliary electrode 40 on the base substrate is located between the orthographic projection of the two subunits on the base substrate.

Exemplary, the display substrate includes a plurality of repeating units 1000, the plurality of repeating units 1000 is distributed in arrays and can be divided into a plurality of repeating unit columns 2000 arranged sequentially along the first direction, each repeating unit column 2000 includes a plurality of repeating units 1000 arranged in the second direction. The repeating unit 1000 includes a plurality of subpixels arranged in the first direction, for example: the repeating unit 1000 includes six subpixels arranged in the first direction, the six subpixels include BRGBRG arranged in the first direction, B represents a blue subpixel, R represents a red subpixel, and G represents a green subpixel. A set of BRGs represents a subunit.

Exemplary, the plurality of subpixels included in the plurality of repeating units 1000 is distributed in arrays, the plurality of subpixels can be divided into plurality of subpixel columns, the plurality of subpixel columns corresponds one-to-one with the plurality of data lines DA included in the display substrate.

The orthographic projection of the auxiliary electrode 40 on the base substrate is located between the orthographic projection of the two subunits on the base substrate, which better utilizes the layout space and reduces the difficulty of the layout of the auxiliary electrode 40.

As shown in FIG. 8 to FIG. 18, FIG. 23 and FIG. 24, in some embodiments, the display substrate further includes a power line VDD and a power compensation line 30.

The subpixel driving circuit further includes a light-emitting control transistor T_em. The first electrode of the light-emitting control transistor T_em is coupled to the power compensation line 30, and the second electrode of the light-emitting control transistor T_em is coupled to the first electrode of the driving transistor DRT.

The power compensation line 30 is coupled to the power line VDD by a sixth via structure, and the sixth via structure is located in the non-opening area of the subpixel.

Exemplary, the plurality of power lines VDD is arranged in the first direction, and the power line VDD includes at least a portion extending along the second direction. In the first direction, the power line VDD is alternately arranged with the repeating unit column 2000.

Exemplary, the sixth via structure includes an eighteenth via Vial8 and a twenty-first via Via21.

In some embodiments, the display substrate further includes a first organic layer, the power compensation line 30 is located between the first organic layer and the base substrate, the power line VDD is located on the side of the first organic layer away from the base substrate, and the sixth via structure runs through the first organic layer.

The sixth via structure is located in the non-opening area of the subpixel, which avoids the space occupied by the sixth connection structure in the opening area, ensures the opening rate of the display substrate, and avoids the impact of the sixth connection structure on the flatness of the light-emitting element.

In some embodiments, the orthographic projection of the power line VDD on the base substrate and the orthographic projection of the repeating unit 1000 on the base substrate are alternately disposed along the first direction.

As shown in FIG. 1, FIG. 2, FIG. 8 to FIG. 18, FIG. 23 and FIG. 24, in some embodiments, the display substrate further includes: a plurality of light-emitting control lines EM, a power line VDD, an initialization signal line *Vini*, a reference signal line Vref, a plurality of first scan lines G1, a plurality of second scan lines G2, a plurality of third scan lines G3 and a plurality of area control lines.

The subpixel driving circuit further includes: a compensation transistor T2, a reset transistor T3, a light-emitting control transistor T_em, a writing control transistor T_com and a storage capacitor Cst.

The gate of the data writing transistor T1 is coupled to the corresponding first scan line G1, and the second electrode of the data writing transistor T1 is coupled to the first electrode of the writing control transistor T_com.

The second electrode of the writing control transistor T_com is coupled to the gate of the driving transistor DRT, and the gate of the writing control transistor T_com is coupled to the corresponding area control line.

The gate of the compensation transistor T2 is coupled to the corresponding second scan line G2, the first electrode of the compensation transistor T2 is coupled to the reference signal line Vref, and the second electrode of the compensation transistor T2 is coupled to the first electrode of the writing control transistor T_com.

The gate of the reset transistor T3 is coupled to the corresponding third scan line G3, the first electrode of the reset transistor T3 is coupled to the initialization signal line *Vini*, and the second electrode of the reset transistor T3 is coupled to the second electrode of the driving transistor DRT.

The gate of the light-emitting control transistor T_em is coupled to the corresponding light-emitting control line EM, the first electrode of the light-emitting control transistor T_em is coupled to the power line VDD, and the second electrode of the light-emitting control transistor T_em is coupled to the first electrode of the driving transistor DRT.

The first plate Cst1 of the storage capacitor Cst is coupled to the gate of the driving transistor DRT, and the second plate Cst2 of the storage capacitor Cst is coupled to the second electrode of the driving transistor DRT.

Exemplary, the initialization signal line *Vini* includes a plurality of first initial portions 21 and a plurality of second initial portions 22, the plurality of first initial portions 21 arranged along the second direction, the plurality of second initial portions 22 arranged along the first direction, the first initial portion 21 includes at least a portion extending along the first direction, the second initial portion 22 includes at least a portion extending along the second direction, the first initial portion 21 is coupled to each of the second initial portions 22, forming a grid structure for the initialization signal line Vini, thereby effectively reducing the voltage drop of the initialization signal line Vini.

As shown in FIG. 5, exemplary, the active layer is configured to form a channel portion included in each of the transistors, a first electrode and a second electrode.

As shown in FIG. 5, exemplary, the first gate metal layer is configured to form the gates of each transistor, the first branch line 111 and the second initial portion 22.

As shown in FIG. 7, exemplary, the second gate metal layer is configured for the second plate of the storage capacitor Cst.

As shown in FIG. 10, exemplary, the first source leakage metal layer is configured to form some conductive connection portions, the reference signal line Vref, the first scan line G1, the second scan line G2, the third scan line G3, the light-emitting control line EM and the first initial portion 21. The reference signal line Vref, the second scan line G2, the first scan line G1, the second branch line 112, the light-emitting control line EM, the power compensation line 30, the third scan line G3 and the first initial portion 21 coupled to the same repeating unit 1000 are respectively arranged along the second direction.

Exemplary, the reference signal line Vref, the first scan line G1, the second scan line G2, the third scan line G3 and the light-emitting control line EM all include at least a portion extending along the first direction.

As shown in FIG. 14, exemplary, the second source leakage metal layer is configured to form the power line VDD, the data line DA, some conductive connection portions and auxiliary electrodes 40. The use of the second source leakage metal layer to make the signal line can effectively reduce the load of the signal line, and provide technical support for medium and large size display products. Exemplary, the auxiliary electrode 40 includes at least a portion extending along the second direction, the auxiliary electrode 40 is coupled to the second electrode layer by a connection pattern 41 made of indium tin oxide material, thereby effectively reducing the voltage drop of the second electrode layer.

Since there is the first organic layer and the first passivation layer between the first source leakage metal layer and the second source leakage metal layer, the distance between the first source leakage metal layer and the second source leakage metal layer is far away, which can effectively reduce the parasitic capacitance between the first source leakage metal layer and the second source leakage metal layer, so as to meet the load requirements of medium and large size display products and provide support for high refresh rates.

As shown in FIG. 1, exemplary, the subpixel driving circuit includes: data writing transistor T1, writing control transistor T_com, driving transistor DRT, compensation transistor T2, reset transistor T3, light-emitting control transistor T_em, storage capacitance Cst, and intrinsic capacitance C1 of light-emitting element EL.

As shown in FIG. 9, vias formed on the interlayer insulation layer are shown. As shown in FIG. 5 to FIG. 10, the gate of the compensation transistor T2 is coupled to the corresponding second scan line G2 via the second via Via2, and the first electrode of the compensation transistor T2 is coupled to the reference signal line Vref via the first via Via1.

The gate of the data writing transistor T1 is coupled to the corresponding first scan line G1 via the third via Via3. The first electrode of the data writing transistor T1 is coupled to the fourth conductive connection portion 54 via the ninth via Via9.

The gate of the writing control transistor T_com is coupled to the area control line G_com via the fourth via Via4, the second electrode of the writing control transistor T_com is coupled to the first conductive connection portion 51 via the fifth via Via5, the first conductive connection portion 51 is coupled to the gate of the driving transistor DRT via the sixth via Via6, and the gate of the driving transistor DRT is also used as the first plate Cst1 of the storage capacitor Cst.

The second electrode of the driving transistor DRT is coupled to the second conductive connection portion 52 via the seventh via Via7. The second conductive connection portion 52 is coupled to the second plate Cst2 of the storage capacitor Cst via the eighth via Via8. The second plate Cst2 of the storage capacitor Cst is coupled to the third conductive connection portion 53 via the tenth via Via10, and the third conductive connection portion 53 is coupled to the second electrode of the reset transistor T3 via the fifteenth via Via15.

The gate of the light-emitting control transistor T_em is coupled to the corresponding light-emitting control line EM via the eleventh via Via11, and the first electrode of the light-emitting control transistor T_em is coupled to the power line VDD through the twelfth via Via12.

The gate of the reset transistor T3 is coupled to the third scan line G3 via the fourteenth via Via14, and the first electrode of the reset transistor T3 is coupled to the first initial portion 21 via the thirteenth via Via13.

The first branch line 111 is coupled to the second branch line 112 via the twenty-second via Via22. The first initial portion 21 is coupled to the second initial portion 22 via the twenty-third via Via23.

As shown in FIG. 12, vias formed on the first organic layer are shown. As shown in FIG. 13, vias formed on the first passivation layer are shown.

As shown in FIG. 11 to FIG. 14, the second conductive connection portion 52 is coupled to the fifth conductive connection portion 55 sequentially via the seventeenth via Via17 and the twentieth via Via20. The fourth conductive connection portion 54 is coupled to the data line DA sequentially via the sixteenth via Via16 and the nineteenth via Via19. The power compensation line 30 is coupled to the power line VDD via the eighteenth via Via18 and the twenty-first via Via21 at once.

As shown in FIG. 16, vias formed on the second passivation layer are shown. As shown in FIG. 17, vias formed on the second organic layer are shown.

As shown in FIG. 15 to FIG. 22, the fifth conductive connection portion 55 is coupled to the corresponding first electrode in the first electrode layer 42 sequentially via the twenty-fourth via Via24 and the twenty-sixth via Via26. The auxiliary electrode 40 is coupled to the connection pattern 41 sequentially via the twenty-fifth via Via 25 and the twenty-seventh via Via27. Connection pattern 41 is coupled to the second electrode layer sequentially via the twenty-eighth via Via28 and the twenty-ninth via Via29.

As shown in FIG. 23, the opening area 60 of the pixel and the non-opening area 61 located near the opening area 60 are shown.

As shown in FIG. 1, in some embodiments, the data writing transistor T1, the compensation transistor T2 and the reset transistor T3 all include a double-gate structure, which can effectively reduce the leakage current.

As shown in FIG. 1, in some embodiments, the writing control transistor T_com includes a single-gate structure.

Since the data writing transistor T1 is connected between the data line DA and the writing control transistor T_com, when the writing control transistor is turned off, the leakage path of the data writing transistor T1 is turned off. The writing control transistor T_com adopts a single-gate structure design, which is conducive to saving the layout area.

The present embodiment also provides a display device, including the display substrate provided by the above embodiment.

It should be noted that the display device may be: TV, monitor, digital photo frame, mobile phone, tablet computer and other products or components with display functions, wherein the display device further includes a flexible circuit board, a printed circuit board and a backboard.

Exemplary, the display device includes an organic light-emitting diode display device, but not limited to this.

In the display substrate provided by the above embodiment, the first connection structure and the second connection structure are both located in the non-opening area of the subpixel, avoiding the first connection structure and the second connection structure occupying space in the opening area, ensuring the opening rate of the display substrate, and avoiding the impact of the first connection structure and the second connection structure on the flatness of the light-emitting element.

Moreover, in the display substrate provided by the above embodiment, the orthographic projection of the first connection structure on the base substrate and the orthographic projection of the second connection structure on the base substrate are arranged in the first direction; the orthographic projection of the second connection structure on the base substrate and the opening area of the subpixel are arranged in the second direction, so that the first connection structure and the second connection structure are located on the same side along the second direction of the opening area, and such that the first connection structure and the second connection structure occupy a small space in the second direction, and can centrally block the first connection structure and the second connection structure, so that the size of the opening area in the second direction can be optimized, effectively improving the opening rate of the display substrate and improving the service life of the display substrate.

The display device provided by the present embodiment also has the above beneficial effect when including the above display substrate, which will not be repeated herein.

It should be noted that the signal line extending in a certain direction refers to: the signal line includes a main part and a secondary part connected to the main part, the main part is a line, line segment or bar, the main part extends in a certain direction, and the length of the main part extending in a certain direction is greater than the length of the secondary part extending in other directions.

It should be noted that "the same film layer" in an embodiment of the present disclosure may refer to a film layer located on the same structural layer. Alternatively, for example, the film layer at the same level may be a film layer formed to have a particular pattern by using the same film-forming process. The film layer may then be patterned by one patterning process using the same mask to form the desired layer structure. Depending on different particular patterns, the one patterning process may include multiple exposing, developing, or etching processes. Further, as an example, a particular pattern in the formed layer structure may be continuous or discontinuous. As other example, these particular patterns may be at different heights or have different thicknesses.

In each method embodiment of the present disclosure, the serial number of the steps can't be configured to limit the order of each step, for ordinary technical personnel in the art, without creative labor, the changes in the order of each step are also within the scope of protection of this disclosure.

It should be noted that each embodiment in the present specification is described in a progressive manner, and the same similar parts between each embodiment can refer to each other, and each embodiment highlights the differences from other embodiments. In particular, for a method embodiment, because it is substantially similar to a product embodiment, it is described relatively simply, and the relevant points can be described in part of the product embodiment.

Unless otherwise defined, the technical or scientific terms used in the present disclosure shall have the usual meaning understood by persons with general skill in the field to which the disclosure belongs. The terms "first", "second" and similar terms used in the present disclosure do not indicate any order, number or importance, but are only configured to distinguish different components. A word such as "include" or "include" means that the element or object appearing before the word covers the element or object listed after the word and its equivalents, without excluding other components or objects. Similar words such as "connect", "couple" or "connection" are not limited to physical or mechanical connections, but may include electrical connections, whether direct or indirect. "Up", "Down", "Left", "Right", etc. are only configured to represent relative position relationships, and when the absolute position of the described object changes, the relative position relationship may also change accordingly.

It may be understood that when a component such as a layer, film, area or substrate is referred to as being located "above" or "below" another element, the element may be "directly" located "above" or "below" another element, or there may be an intermediate element.

In the description of the above embodiments, specific features, structures, materials or features may be combined in any one or more embodiments or examples in a suitable manner.

The above is only a specific embodiment of the present disclosure, but the scope of protection of the present disclosure is not limited to this, and any person familiar with the art can easily think of changes or replacements within the scope of the technology disclosed in this disclosure, and should be covered by the scope of protection of this disclosure. Therefore, the scope of protection of the present disclosure shall be subject to the scope of protection of the claims mentioned.

What is claimed is:

1. A display substrate, comprising a base substrate, a plurality of repeating units, and a plurality of data lines on the base substrate, wherein:

the plurality of repeating units are divided into a plurality of repeating unit columns;

each repeating unit comprises a plurality of subpixels, the subpixel comprises a subpixel driving circuit, the subpixel driving circuit comprises a data writing transistor, a writing control transistor and a driving transistor; a first electrode of the data writing transistor is coupled to a corresponding data line, a second electrode of the data writing transistor is coupled to a first electrode of the writing control transistor, and a second electrode of the writing control transistor is coupled to a gate of the driving transistor;

the display substrate further comprises: a plurality of control areas and a plurality of area control lines; the control area comprises at least one repeating unit column; the area control lines are respectively coupled to gates of the writing control transistors comprised in each repeating unit column in the corresponding control area;

the area control lines each comprises a control bus and at least one control branch line;

the control branch line is coupled to the gates of each writing control transistor comprised in a corresponding column of repeating unit column in the corresponding control area;

the control bus is coupled to at least one control branch line;

the control branch line comprises a first branch line and a plurality of second branch lines;

the second branch lines each comprises at least a portion extending in a first direction, and the plurality of second branch lines are arranged in a second direction;

the first branch line comprises at least a portion extending in the second direction, the first branch line is coupled to the plurality of second branch lines, the first branch line is coupled to the control bus;

the first direction intersects with the second direction; and the second branch line is coupled to the gates of each writing control transistor comprised in the corresponding repeating unit.

2. The display substrate according to claim 1, wherein in the same control area, the adjacent second branch lines in the first direction are coupled with each other.

3. The display substrate according to claim 1, wherein in the same control area, the adjacent second branch lines in the first direction are independent from each other.

4. The display substrate according to claim 3, wherein the display substrate further comprises a plurality of power lines, orthographic projections of the second branch lines onto the base substrate do not overlap with the orthographic projections of the power lines onto the base substrate.

5. The display substrate according to claim 1, wherein orthographic projections of the data lines onto the base substrate and orthographic projections of the second branch lines onto the base substrate have a first overlapping area, and the areas of the first overlapping areas formed by the data lines are the same.

6. The display substrate according to claim 1, wherein the first branch line is made of a first gate metal layer in the display substrate, and the second branch line is made of a first source leakage metal layer in the display substrate.

7. The display substrate according to claim 1, wherein the display substrate further comprises: a plurality of first scan lines, a plurality of second scan lines, a plurality of third scan lines, a plurality of light-emitting control lines, power lines, reference signal lines and initialization signal lines;

the subpixel driving circuit further comprises: a compensation transistor, a reset transistor, a light-emitting control transistor and a storage capacitor;

the gate of the data writing transistor is coupled to the corresponding first scan line;

the gate of the compensation transistor is coupled to the corresponding second scan line, the first electrode of the compensation transistor is coupled to the reference signal line, and the second electrode of the compensation transistor is coupled to the first electrode of the writing control transistor;

the gate of the reset transistor is coupled to the corresponding third scan line, the first electrode of the reset transistor is coupled to the initialization signal line, and the second electrode of the reset transistor is coupled to the second electrode of the driving transistor;

the gate of the light-emitting control transistor is coupled to the corresponding light-emitting control line, the first electrode of the light-emitting control transistor is coupled to the power line, and the second electrode of the light-emitting control transistor is coupled to the first electrode of the driving transistor;

the first plate of the storage capacitor is coupled to the gate of the driving transistor, and the second plate of the storage capacitor is coupled to the second electrode of the driving transistor.

8. The display substrate according to claim 7, wherein the data writing transistor, the compensation transistor and the reset transistor all comprise a double-gate structure.

9. The display substrate according to claim 1, wherein the writing control transistor comprises a single-gate structure.

10. A method for driving a display substrate, wherein:

the display substrate comprises a base substrate, a plurality of repeating units and a plurality of data lines on the base substrate;

the plurality of repeating units are divided into a plurality of repeating unit columns;

each repeating unit comprises a plurality of subpixels, the subpixel comprises a subpixel driving circuit, the subpixel driving circuit comprises a data writing transistor, a writing control transistor and a driving transistor; a first electrode of the data writing transistor is coupled to a corresponding data line, a second electrode of the data writing transistor is coupled to a first electrode of the writing control transistor, and a second electrode of the writing control transistor is coupled to a gate of the driving transistor;

the display substrate further comprises: a plurality of control areas and a plurality of area control lines; the control area comprises at least one repeating unit column; the area control lines are respectively coupled to gates of the writing control transistors comprised in each repeating unit column in the corresponding control area; and the method comprises:

in the N-frame display period, the zone control signals transmitted by at least part of the multiple area control lines in the display substrate are at an active level, and the writing control transistors coupled to at least part of the area control lines are conductive, and the plurality of subpixels are scanned progressively to achieve progressive writing of data signals; and in the N+1 frame display period, the level of the zone control signals transmitted by the plurality of area control lines change, so that the writing control transistor coupled to the area control line transmitting the zone control signal at an active level is conductive, and the plurality of subpixels is scanned progressively to achieve progressive writing of data signals.

11. The method according to claim 10, the driving method further comprises:

a blanking period, which is located at a beginning or end of each frame's display period; during the blanking period, the levels of the zone control signals transmitted by the plurality of area control lines are adjusted.

12. A display device, comprising a display substrate, wherein:

the display substrate comprises a base substrate, a plurality of repeating units and a plurality of data lines on the base substrate;

the plurality of repeating units are divided into a plurality of repeating unit columns;

each repeating unit comprises a plurality of subpixels, the subpixel comprises a subpixel driving circuit, the subpixel driving circuit comprises a data writing transistor, a writing control transistor and a driving transistor; a first electrode of the data writing transistor is coupled to a corresponding data line, a second electrode of the data writing transistor is coupled to a first electrode of the writing control transistor, and a second electrode of the writing control transistor is coupled to a gate of the driving transistor;

the display substrate further comprises: a plurality of control areas and a plurality of area control lines; the control area comprises at least one repeating unit column; the area control lines are respectively coupled to gates of the writing control transistors comprised in each repeating unit column in the corresponding control area;

the area control lines each comprises: a control bus and at least one control branch line;

the control branch line is coupled to the gates of each writing control transistor comprised in a corresponding column of repeating unit column in the corresponding control area;

the control bus is coupled to at least one control branch line;

the control branch line comprises a first branch line and a plurality of second branch lines;

the second branch lines each comprises at least a portion extending in a first direction, and the plurality of second branch lines are arranged in a second direction;

the first branch line comprises at least a portion extending in the second direction, the first branch line is coupled to the plurality of second branch lines, the first branch line is coupled to the control bus;

the first direction intersects with the second direction; and the second branch line is coupled to the gates of each writing control transistor comprised in the corresponding repeating unit.

13. The display device according to claim 12, wherein in the same control area, the adjacent second branch lines in the first direction are coupled with each other.

14. The display device according to claim 12, wherein in the same control area, the adjacent second branch lines in the first direction are independent from each other.

15. The display device according to claim 14, wherein the display substrate further comprises a plurality of power lines, orthographic projections of the second branch lines onto the base substrate do not overlap with the orthographic projections of the power lines onto the base substrate.

16. The display device according to claim 12, wherein orthographic projections of the data lines onto the base substrate and orthographic projections of the second branch lines onto the base substrate have a first overlapping area, and the areas of the first overlapping areas formed by the data lines are the same.

17. The display device according to claim 12, wherein the writing control transistor comprises a single-gate structure.

* * * * *